United States Patent [19]

Steinman

[11] Patent Number: 5,794,005
[45] Date of Patent: Aug. 11, 1998

[54] SYNCHRONOUS PARALLEL EMULATION AND DISCRETE EVENT SIMULATION SYSTEM WITH SELF-CONTAINED SIMULATION OBJECTS AND ACTIVE EVENT OBJECTS

[75] Inventor: Jeffrey S. Steinman, Chatsworth, Calif.

[73] Assignee: The United States of America as represented by the Administrator of the National Aeronautics and Space Administration, Washington, D.C.

[21] Appl. No.: 363,546

[22] Filed: Dec. 12, 1994

Related U.S. Application Data

[63] Continuation-in-part of Ser. No. 246,372, May 13, 1994, abandoned, which is a continuation-in-part of Ser. No. 880,211, Jan. 21, 1992, abandoned.

[51] Int. Cl.$^6$ .................................................... G06F 19/00
[52] U.S. Cl. ...................... 395/500; 395/683; 395/557; 364/578
[58] Field of Search ................... 395/500, 683, 395/557; 364/140, 578

[56] References Cited

U.S. PATENT DOCUMENTS

| | | | |
|---|---|---|---|
| 4,901,260 | 2/1990 | Lubachevsky | 364/578 |
| 5,247,650 | 9/1993 | Judd et al. | 395/500 |

OTHER PUBLICATIONS

Chandy, K. and Misra, J. "Distributed Simulation: A Case Study in design and Verification of Distributed Programs", IEEE Transactions on Software Engineering, vol. SE–5, No. 5, pp. 440–452, 1979.

Felderman, R. and Kleinrock, L. "Two Processors Time Warp Analysis: Some Results on a Unifying Approach", Proceedings of the SCS Multiconference on Advances in Parallel Processing, vol. 3, pp. 34–41.

Fujimoto, R. "Design and Evaluation of the Rollback Chip: Special Purposes Hardware for Time Warp", IEEE Transactions of Computers, vol. 41, No. 1, pp. 68–82, 1992.

(List continued on next page.)

Primary Examiner—Kenneth S. Kim
Attorney, Agent, or Firm—John H. Kusmiss

[57] ABSTRACT

The present invention is embodied in a method of performing object-oriented simulation and a system having interconnected processor nodes operating in parallel to simulate mutual interactions of a set of discrete simulation objects distributed among the nodes as a sequence of discrete events changing state variables of respective simulation objects so as to generate new event-defining messages addressed to respective ones of the nodes. The object-oriented simulation is performed at each one of the nodes by assigning passive self-contained simulation objects to each one of the nodes, responding to messages received at one node by generating corresponding active event objects having user-defined inherent capabilities and individual time stamps and corresponding to respective events affecting one of the passive self-contained simulation objects of the one node, restricting the respective passive self-contained simulation objects to only providing and receiving information from the respective active event objects, requesting information and changing variables within a passive self-contained simulation object by the active event object, and producing corresponding messages specifying events resulting therefrom by the active event objects.

5 Claims, 10 Drawing Sheets

OTHER PUBLICATIONS

Fujimoto, R. "Lookahead in Parallel Discrete–Event Simulation", International Conference on Parallel Proccessing, vol. 3, pp. 34–41, 1988.

Fujimoto, R. "Parallel Discrete Event Simulation", Communications of the ACM, vol. 33, No. 10, pp. 30–53, 1990.

Gordon, L. "On Distributed Simulation Involving Human Interaction", Proceedings of the SCS Summer Computer Simulation Conference, pp. 1–4, 1992.

Jefferson, D. "Virtual Time", ACM Transaction on Programming Languages and Systems, vol. 7, No. 3, pp. 404–425, 1985.

Loral Systems Company, "Strawman Distributed Interactive Simulation Architecture Description Document", Prepared for Program Manager–Training Devices Naval Training Systems Center, vol. 1–2, 1992.

Lubachevsky, B. "Several Unsolved Problems in Large-Scale Discrete Event Simulations", In Proceedings of the 7th Workshop on Parallel and Distributed Simulation (PADS93), vol. 23, pp. 60–67, 1993.

Steinman, J. "SPEEDES: A Unified Approach to Parallel Simulation", Proceeding of the SCS Multiconference on Advances in Parallel and Distributed Simulation, vol. 24, No. 1, 1992.

Weiland, F. "A Critical Path Tool for Parallel Simulation Performance Optimization", Proceedings of the International Conference on System Sciences, 1991.

Dickens, D., and Reynolds, P. "SRADS With Local Rollback." Proceedings of the SCS Multi–Conference on Distributed Simulation. vol. 22, No. 1, Jan. pp. 161–164, 1990.

Felderman, R., and Kleinrock, L. "Two Processor Time Warp Analysis: Some Results on a Unifying Approach." Proceedings of the SCS Multiconference on Advances in Parallel and Distributed Simulation. vol. 23, No. 1, pp. 3–10, 1991.

Fox, G. Solving Problems on Concurrent Processors. vol. 1 Prentice Hall, Engleeood Cliffs, New Jersey, 1988.

Fujimoto, R., Tsai, J., and Gopalakrishnan, G. "Design and Evaluation of the Rollback Chip: Special Purpose Hardware for Time Warp." Technical Report UUCS–88–011, Department of Computer Science, University of Utah, 1988.

Jones, D. "An Empirical Comparison of Priority–Queue and Event–Set Implementations." Communications of the ACM. vol. 29, No. 4, pp. 300–311, 1986.

Kaudel, F. "A Literature Survey on Distributed Discrete Event Simulation." Simuletter, vol. 18, No. 2 pp. 11–21, 1987.

Lin, Y., and Lazowska, E. "Exploiting Lookahead in Parallel Simulation." IEEE Transactions on Parallel and Distributed Systems, vol. 1, No. 4, pp. 457–469 1990.

Lin, U., and Lazowska, E. "Processot Scheduling for Time Warp Parallel Simulation." Proceedings of the SCS Multiconference on Advances in Parallel and Distributed Simulation. vol. 23, No. 1, pp. 11–14, 1991.

Lubachevsky, B. "Bounded Lag Distributed Discrete Event Simulation." MultiConference on Distributed Simulation. Feb., pp. 183–191, 1988.

Nicol, D. "Performance Bounds on Parallel Self–Initiating Disctete Event Simulation." Technical NASA Contractor Report 182010. ICASE Report No. 90–21, 1990.

Reynolds, P. "A Spectrum of Options for Parallel Simulation." Proceedings of the 1988 Winter Simulation Conference, pp. 325–332, 1988.

Reynolds, P. "An Efficient Framework for Parallel Simulations." Ptoceedings of the SCS Multiconference on Advances in Parallel and Distributed Simulation. vol. 23, No. 1, pp. 167–174, 1991.

Sleator, D., and Tarjan, R. "Self Adjusting Binary Search Trees." Journal of the ACM. vol. 32, No. 3, pp. 652–686, 1985.

Sokol, L., Stucky, B., and Heang, V. "MTW: A Control Mechanism for the Parallel Discrete Simulation." International Conference on Parallel Ptocessing vol. 3, Aug., pp. 250–254, 1989.

Steinman, J. "Multi–Node Test Bed: A Distributed Emulation of Space Communications for the Strategic Defense System." Proceedings of the Twenty–First Annual Pittsburgh Conference on Modeling and Simulation. vol. 21, Part 3, May, pp. 1111–1115, 1990.

Steinman, SPEEDES: Synchronous Parallel Environment for Emulation . . . . Publication date 1990, pp. 95–103.

Jefferson, The Status of Time Warp Operating System, 1988, pp. 738–744.

SYNCHRONOUS PARALLEL EMULATION AND DISCRETE EVENT SIMULATION SYSTEM WITH SELF-CONTAINED SIMULATION OBJECTS AND ACTIVE EVENT OBJECTS

CROSS-REFERENCE TO RELATED APPLCIATION

This application is a continuation-in-part of application Ser. No. 08/246,372 filed by Steinman on May 13, 1994, abandoned, entitled "SYNCHRONOUS PARALLEL SYSTEM FOR EMULATION AND DISCRETE EVENT SIMULATION" which is a continuation-in-part of application Ser. No. 07/880,221 filed by Steinman on Jan. 21, 1992 abandoned, entitled "SYNCHRONOUS PARALLEL SYSTEM FOR EMULATION AND DISCRETE EVENT SIMULATION."

ORIGIN OF INVENTION

The invention described herein was made in the performance of work under a NASA contract, and is subject to the provisions of Public Law 96-517 (35 USC 202) in which the contractor has elected not to retain title.

TECHNICAL FIELD

The invention relates to discrete event simulation of objects using a plurality of synchronous parallel computers in communication with each other so that the objects being simulated may interact.

BACKGROUND ART

Discrete event simulation of objects on a single digital processor is not very difficult. In the standard approach, all events associated with a simulated object are tagged with a time index, inserted in an event queue, and maintained in increasing time order by the event queue as events in the simulation are scheduled at discrete points in time. Simulation proceeds in the computer by processing the event from the queue having the lowest time index. The resulting simulation of events in sequence is thus defined by the time indices.

Processing an event can affect the state variables of an object and can schedule new events to occur in the future for one or more simulated objects. This interaction of cause and effect requires that new events generated be tagged with time indices greater than or equal to the current simulation time index. The generated new events are simply inserted into the event queue in their proper time index sequence.

Discrete event simulation on parallel processors is necessarily very different from the single processor approach described above. (See D. A. Reed, "Applications: Distributed Simulation," *Multicomputer Networks: Message-Based Parallel Processing*, The MIT Press, Cambridge, Mass., pp. 239–267, 1987.) While it is clear that real world objects may interact concurrently in time, it is not always obvious how to rigorously simulate them on parallel processors. The event queue approach presents the problem of having each processor of the parallel array continually determine whether it should process the next event in its queue, or wait because a new event with an earlier time index is arriving from another processor. Moreover, the simulation program would have to be optimistic that events tagged for simulation at a later time index would not be dependent upon the results of other events triggered by events simulated conservatively up to the time of the next event in the queue.

Various techniques have been proposed to solve this problem, each with its respective strengths and weaknesses. This background discussion will cover only the parallel simulation techniques that are relevant to the understanding of the present invention.

The simplest time driven approach to parallel simulation makes use of the causality principle as illustrated in J. S. Steinman, "Multi-Node Test Bed: A Distributed Emulation of Space Communications for the Strategic Defense System," Proceedings of the Twenty-First Annual Pittsburgh Conference on Modeling and Simulation, Pittsburgh, 1990. The causality principle allows for events scheduled between time 0 and time T to be processed conservatively in parallel up to the event horizon at time T.

The event horizon for a cycle is defined to be the point in time where an event to be processed has a later time index than the earliest new event generated in the current cycle. Simulation errors can occur if events are processed optimistically beyond the event horizon. For this scheme, known as the time-bucket approach, the minimum time delay T between an event and any of its generated events must be known in order to predict the event horizon. Parallel processing can then take place in cycles of duration T. As long as the minimum time interval between events and the events that they generate is known, the simulation can proceed in time cycles of duration T.

This time-bucket approach has the important property of requiring very little overhead for synchronization. For example, each processor in the Hypercube array of processors need only synchronize with all of the other processors at the end of every cycle, after which all processors increment their simulation time in unison by the amount T and proceed to simulate other scheduled events.

Despite the low synchronization overhead of the time-bucket approach, there are some major drawbacks to that approach. The cycle duration T must be large enough so that each processor is able to process enough events to make parallel simulation efficient. However, the cycle duration T must also be small enough to support the required simulation fidelity. Another important problem is the balancing of the work load. Because of the synchronous nature of the time-bucket approach, when one processor has more work to do than other processors in a cycle, the simulation will be inefficient. Because of these drawbacks, a more flexible approach is needed.

Optimistic discrete event simulation approaches must allow for event simulation to occur in error, but when one does occur, a roll-back algorithm is needed to undo the erroneously simulated event. Various optimistic approaches have been proposed (L. Sokol, D. Briscoe and A. Wieland, "MTW: A Strategy for Scheduling Discrete Simulation Events for Concurrent Execution," Proceedings of the SCS Distributed Simulation Conference, Vol. 19, No. 3, pp. 34–42, 1988; K. Chandy and R. Sherman "Space Time and Simulation," Proceedings of the SCS Distributed Simulation Conference, Vol. 21, No. 2, pp. 53–57, 1989.) By far the most popular optimistic approach is the time-warp operating system (D. Jefferson, "Virtual Time," ACM Transactions on Programming Languages and Systems, Vol. 7, No. 3, pp. 404–425, 1985) in which simulation errors are handled by the generation of antimessages which cause the simulation to roll back to a time before the simulation error occurred.

Because some events can generate future events, and they in turn can generate other future events, cascading of the error may occur which complicates the roll-back algorithm. Messages and state variables must be saved for each processed event in order to be able to implement a rollback algorithm if it becomes necessary.

Traditional time-warp implementations have required a large amount of memory overhead. That memory overhead could be better used for the simulation data. As long as the roll-back overhead is small compared to the average amount of time it takes to process an event, the time-warp approach will have high performance. However, larger data processing units typically execute programs faster, thereby increasing the occurrences of time warp. In that case, the memory overhead of time warp could reduce the overall simulation performance to an unacceptable level.

STATEMENT OF THE INVENTION

A new method has been developed for synchronous parallel environment for emulation and discrete event simulation. Central to the new method is a technique called breathing time buckets (BTB) which uses some of the conservative techniques found in the prior-art time-bucket synchronization, along with some of the optimistic techniques of the prior-art time-warp approach.

An event is created by an input message generated internally by the same processor or externally by another processor. A system for routing messages from each processor to designated processors, including itself (hereinafter referred to as a "multirouter" directs the message to the processor that is intended to process the event. The events are defined through various virtual functions by the user during initialization. It is through these virtual functions that events are processed. Note that multiple messages for an object with the same time index will generate multiple events for that object, not a single event for multiple messages. The events are thus initialized by data contained within the messages. After initialization the messages are discarded, and each event is attached to its own simulation object.

A processor optimistically performs its calculations for the event and generates messages to schedule future events to be generated in the same processor or any other processor, but the generated messages are not immediately released. Changes required in the variables of the object affected by the event are calculated and stored. Immediately afterwards the changes calculated are exchanged for the values of the affected variables of the object. If for any reason the variables should not yet have been affected, such as because an event processed by another object generates a message for the affected object in its past, the event being generated must be rolled back. That is accomplished in the BTB algorithm by exchanging back the computed changes for the old values of the affected variables and canceling any messages generated but not yet released. In that manner, the shortcomings of the prior-art time-bucket technique are overcome in most situations by permitting events to be optimistically processed, and if it results that a message should not have been processed, the processed event is rolled back and any messages generated in the processing of the event are discarded.

External interactions are made possible by using a host program connected to the parallel computers that services communications between external user modules and the parallel computers. A useful interactive capability is the ability for a user to query or monitor the state of simulation objects while the simulation is in progress. For this purpose, the simulation system of parallel computers constitutes a large data base of objects that can be accessed from a user module. Further useful interactive capabilities are to issue commands from the outside world (which schedules events within the parallel simulation), and to synchronize external modules dynamically.

Breathing Time Warp is a new process for parallel discrete-event simulation. It adaptively merges the best of Breathing Time Buckets and Time Warp to solve the potential shortcomings of each algorithm. Time Warp can be unstable because of potential antimessage explosions while Breathing Time Buckets can be inefficient if the average number of events processed per cycle is low. Breathing Time Warp has neither of these problems.

Development of the Breathing Time Warp algorithm was motivated by the general observation that events close to GVT (in terms of number of events, not time), tend to be processed correctly while events far from GVT have a greater chance or being rolled back. Thus, it makes sense to aggressively send the generated messages from events close to GVT while not immediately releasing the messages generated from events far from GVT. This approach then provides a much more stable environment for optimistic parallel discrete-event simulation.

A new approach for determining GVT uses two values, N1, and N2, to determine when to compute GVT, and how much to limit the optimist of the simulation. This approach (in conjunction with the incremental state-saving techniques used by SPEEDES) effectively eliminates the need for memory-protection algorithms such as the cancel-back algorithms which are typically found in some advanced Time Warp systems.

The novel features that are considered characteristic of this invention are set forth with particularity in the appended claims. The invention will best be understood from the following description when read in connection with the accompanying drawings.

In addition to the Delta Exchange mechanism, the present invention provides a Rollback Queue for incrementally saving the state of the object as it is modified by event processing. When an event changes the state of its simulation object, a rollback item is pushed onto the top of the Rollback Queue and specific rollback items, which are C++ objects, inherit from a base-class rollback item object. Also, storing values, rolling back an event, or cleaning up the Rollback Queue is accomplished through store, rollback and cleanup virtual functions which are defined by the base-class rollback item. Further, new types of rollback items can be easily added into the SPEEDES environment.

The present invention also provides a new technique for supporting lazy cancellation, which allows events, which are C++ objects in SPEEDES, to be processed out of order when each event does not effect another event. Lazy cancellation is supported by SPEEDES with an object oriented approach because accidentally processed events for a simulation object in the work order might not matter. For example, in prior approaches, when a rolledback event is reprocessed, the same answer might be produced. In other words, the event makes the same state changes to the simulation object while also generating the same events. Sending antimessages (if Time Warp is used) only to later regenerate the same messages again for events that are rolled back having the same properties is wasteful. Also, reprocessing the event if it makes the same changes to the state of its simulation object is wasteful and inefficient.

Lazy cancellation avoids the inefficiencies of the prior approaches because it is supported by SPEEDES as an object-oriented approach. The state of the simulation object is rolled forward using the state change made by the event the first time it was processed without the need for memory overhead. Because events are objects in SPEEDES, the inputs from the simulation object that are required for processing an event are saved in the data structures of the event object.

Lazy cancellation is performed so that the event-processing inputs are first saved from the simulation object in the event object, and then, before reprocessing the event, SPEEDES determines whether the input values of the simulation object changed or if the input values would produce a different result. If the input values are the same, the event is rolled forward, otherwise, an antimessage is sent. This approach is much more efficient than making byte-for-byte comparisons of the old state of the simulation object with its new states, which is done in the prior approaches.

The lazy cancellation approach of the present invention is also more flexible. Events can store important input information in their internal data structures to support sophisticated optimization techniques as well. For example, the user may enable lazy cancellation only for specific events, while using aggressive or optimistic cancellation as the default for all other cases.

DETAILED DESCRIPTION OF THE INVENTION

Figure 1:
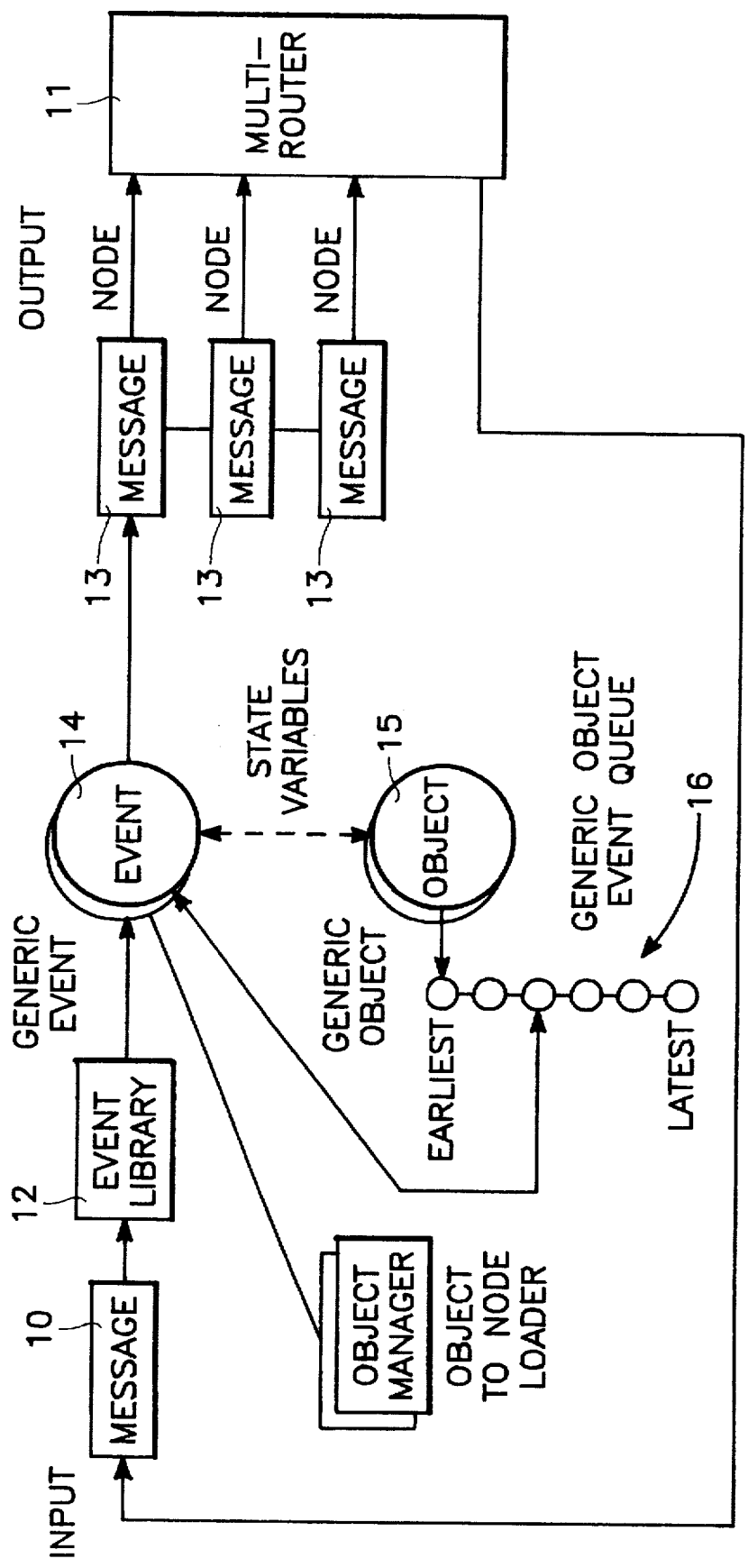
FIG. 1 is a block diagram illustrating the object-based architecuture at a single node of the invention.

The object-based architecture of the simulation process of the invention carried out at each node is illustrated for a single simulation object in FIG. 1. Discrete event simulation of objects begins with some basic steps for a single processor, such as a processor at a node of a Hypercube. First an event object is initiated by an input message 10 for a simulation object received via a multirouter 11 from the same processor or another processor. Time tagged messages received are queued in an event library 12. Multiple messages for a simulation object with the same time index will generate multiple event objects for the simulation object.

All event objects are user-defined as to their inherent capabilities from a base-class of generic simulation objects, where the term "objects" refers to object oriented programming techniques used to simulate physical objects assigned to processors for simulation of events, such as missiles, airplanes, tanks, etc., for simulation of war games, for example.

Event objects 14 are initialized by data contained within the messages received. After an event object is initialized, the message for it is discarded. Each event object is then attached to its own simulation object by a pointer to the simulation object 15.

Processing an event object in a processor is done in multiple steps that are written by the user into the simulation program. In the first step, an event object optimistically performs its calculations and generates messages 13 to schedule future events. However, the event object of the input message 10 is not immediately executed, i.e., the state of the simulation object, is not changed, and the messages for future event objects are not immediately released. Instead, the state changes and the generated messages are stored in the event object 14. Only the changes of the simulation object state variables are stored within the event object 14.

In the second step, the state variable changes that were computed in the first step are exchanged with the simulation object 15 so that the event object then has the old state values and the simulation object has the new values. For example, the state variables may consist of 1000 bytes. If the event requires only four bytes to be changed, only those four bytes are saved and exchanged. If rollback is later required, another exchange restores the previous state of the simulation object.

This feature, referred to as "delta exchange," reduces memory used in optimistic simulations at the expense of having to supply the exchange code in the simulation. Performing a delta exchange involves negligible time, so that rollback is carried out efficiently when needed without the need of special-purpose hardware.

The simulation program may include as part of delta exchange, the step of each time writing out to files these deltas. The simulation may then be rewound if rollback is necessary through several pairs of steps resulting in a reverse delta exchange for several events in sequence 16, thus restoring the changes in reverse order from the files.

A delta exchange completes the first phase of carrying out an event, but as just noted, although the state of the simulation object is changed in the first phase, it can be rolled back. In the second phase, further processing is carried out, such as cleaning up memory, or sending messages 13 out to this and/or other processors and to graphics for record or display. This phase is carried out only after the event object is known to be valid so that there is no possibility of a rollback being required. Consequently, it is usually performed much later in time than the two steps in the first phase, but always without changing the state variables of the simulation object.

SPEEDES Internal Structure

The invention is realized in a simulation system called Synchronous Parallel Environment for Emulation and Discrete Event Simulation ("SPEEDES").

While other multiple-synchronization systems (or test beds) have been developed, one reason for the success of SPEEDES is its unique object-oriented design. To begin this discussion, we first break event processing into some very basic steps (see FIG. 1).

Creating an Event

An event is created by a message. Note that multiple messages for an object with the same time stamp will generate multiple events, not a single event with multiple messages. Events are separate objects in C++ and should not be confused with simulation objects. User-defined events inherit capabilities from a base-class generic event object, which defines various virtual functions. It is through these virtual functions that events are processed.

An important optimization is in the use of free lists for memory management. SPEEDES manages old messages and events in a free list and reuses them whenever possible. This speeds up memory management and avoids the memory fragmentation problem.

Initializing an Event

Events are initialized by data contained within the message through a user-supplied virtual initialization function. After the event is initialized, the message is discarded into a free list. Each event is then attached to its own simulation object (i.e., the event object receives a pointer back to the simulation object).

Processing an Event: Phase 1

Processing an event is done in multiple steps that are all supported with C++ virtual functions written by the user. In the first step, an event optimistically performs its calculations and generates messages to schedule future events. However, the simulation object's state must not change. In addition, messages that would generate future events are not immediately released.

The event object itself stores changes to the simulation object's state and the generated messages. Only variables affected by the event are stored within the event object. Thus, if a simulation object contains 50,000 bytes and an event requires changing one of those bytes, only that one byte is stored within the event. There is no need to save copies of all 50,000 bytes of the object in case of rollback.

Delta Exchange

In the second step, the values computed in Phase 1 are exchanged with the simulation object. This exchange is performed immediately after the first step. After an exchange, the event has the old state values and the simulation object has the new values. Two successive exchanges (in the case of rollback) then restore the simulation object's state.

When an event is rolled back, there are two possibilities concerning messages that were generated by the Phase 1 processing. One is that the messages have already been released. In this case, antimessages must be sent to cancel those erroneous messages. The other is that the messages have not been released yet. In this case, the messages are simply discarded.

The Delta Exchange mechanism greatly reduces memory consumption in optimistic simulations. However, it has the drawback of forcing the user to supply the exchange code. Errors could creep into the simulation if care is not taken in this step.

Performing the Delta Exchange method normally involves a negligible amount of time. Thus, sequential simulations are still efficient even when this extra step is performed. Further, because the Delta Exchange mechanism normally has low overhead, special-purpose hardware to support rollback efficiently may not be necessary.

The Delta Exchange mechanism has the added benefit of permitting fast rewind capabilities. Much like an efficient text editor that saves only the keystrokes (i.e., changes to the text file), the Delta Exchange mechanism saves the changes to the simulation objects. These changes (stored in events) can be written out to files. The simulation can be rewound by restoring the changes in reverse order. This is like hitting the undo button in a text editor. The rewind capability can be used for restarting the simulation after crashes, check-point restarting, what if analysis, or playback.

Processing an Event: Phase 2

In the third step, further processing is done for an event. This usually involves cleaning up memory or sending external messages out to graphics. This step is performed only after the event is known to be valid, in other words, when there is no possibility for the event to be rolled back. This step is usually performed much later in time than the previous two steps. The simulation programmer should not assume that the simulation object contains valid state information when processing in Phase 2. The processing done in this step must not change the state variables of its simulation object.

Managing the Event List

One of the most time-consuming tasks in supporting discrete event simulations can be managing the event list. Managing a sorted list of future events can cripple the performance of low-granularity simulation. In parallel discrete event simulations, such management often leads to superlinear speedup. SPEEDES makes use of a new technique for handling the event list.

Figure 2:
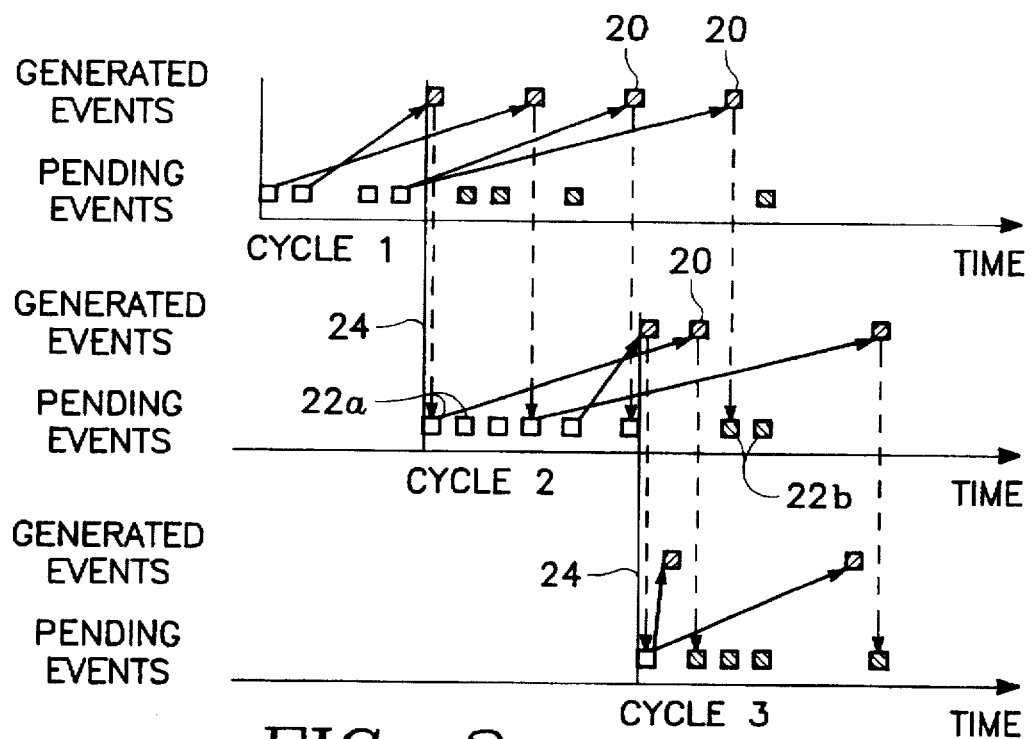
FIG. 2 is a timing diagram illustrating three successive cycles of operation of the invention and the event horizons thereof.

The basic idea of this new technique is that two lists are continually maintained. The primary list is sorted, while the secondary list is unsorted. As new events are scheduled, they are put into the secondary list. The earliest event scheduled to occur in the secondary list is preserved. When the time to process this event comes, the secondary list is sorted and then merged into the primary list. The time stamp of this critical event is sometimes called the event horizon. How the invention processes event objects in successive cycles defined by an event horizon is illustrated in FIG. 2, which is discussed in detail below with reference to the description of the Breathing Time Buckets simulation protocol. Basically, in FIG. 2 events 20 generated during one cycle of the simulation become pending events 22 during the next cycle. Each cycle only processes those pending events 22a which do not occur beyond the event horizon 24 of that cycle. Those pending events 22b which occur beyond the event horizon are not processed during the current cycle.

This simple approach for managing the event list is faster than single-event insertions into linked lists. It can also outperform some of the more complicated data structures such as splay trees and priority heaps, if enough events are collected in the secondary queue on the average for each cycle.

Event Queue Objects and Multiple Protocols

In a SPEEDES simulation, the user does not supply the main program. The main program is provided by SPEEDES, which, during initialization, reads in a standard file to configure the simulation. The user can select the synchronization protocol by modifying this file.

SPEEDES supports multiple-synchronization protocols by creating an appropriate event queue object. Each protocol has its own specific event queue C++ object, which is created during initialization. Each event queue object is then responsible for performing its specific synchronization algorithm for the simulation. Event queue objects must follow the rules for event processing (Phase 1, Delta Exchange, Phase 2).

In the creation of C++ objects that make use of inheritance, the lower base-class objects are constructed before the higher ones. Thus, when the main program crates one of the event queues, the generic base-class event queue object is constructed first. The constructor of this base-class automatically calls the user code that creates all the simulation objects and initializes them with their starting events. This is how the user plugs his code into the SPEEDES environment.

Figure 3:
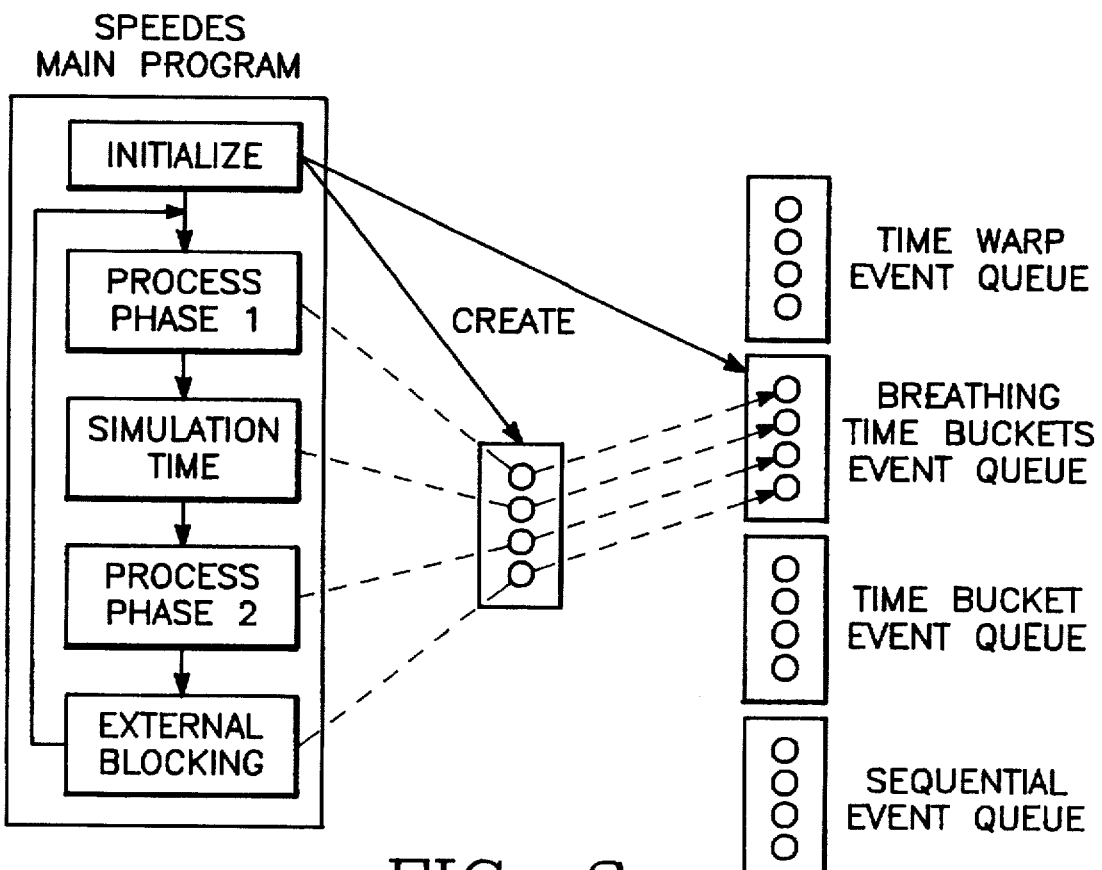
FIG. 3 is a block diagram illustrating the architecture of the main program of the invention.

After initialization, the main program in SPEEDES loops until the simulation is done. During each loop, four virtual functions illustrated in FIG. 3 are called for the event queue object:

1. PROCESS PHASE 1
2. SIMULATION TIME
3. PROCESS PHASE 2
4. EXTERNAL BLOCKING

Phase 1 and Delta Exchange event processing is performed for events during the event queue PROCESS PHASE 1 method. Many events are typically processed in this step. When it is determined that enough events have been processed and that it is time to synchronize, the global simulation time (for example, Global Virtual Time [GVT] in Time Warp) is then determined in the SIMULATION TIME method. Cleanup, synchronous message sending, and further event processing are done in the PROCESS PHASE 2 method. If the simulation expects the outside world to send a message that must arrive before the simulation can continue, blocking is done in the EXTERNAL BLOCKING method.

Message Sending

SPEEDES uses both synchronous and asynchronous message sending approaches. Time Warp uses the asynchronous style, while the other algorithms synchronously send their messages.

There are two extremes for event processing and message sending. In one extreme, events take very little cpu time to be processed; message sending is the bottleneck. Here, synchronous message sending wins because it is faster. In the other extreme, events take a very long time to be processed; event processing is the bottleneck. In this case, message sending delays do not affect the simulation's performance and it does not matter whether synchronous or asynchronous approaches are used. However, somewhere between these two extremes is a boundary where one approach may be better than the other.

SPEEDES SIMULATION PROTOCOLS

As illustrated in FIG. 3, the SPEEDES main program interfaces through a generic event queue with any one of several different protocols, including the well-known protocols of time warp event queue, time bucket event queue and sequential event queue. This section briefly discusses the well-known parallel simulation protocols supported by SPEEDES, while the next section explains the new parallel simulation approach, Breathing Time Buckets, in more detail. Following the discussion of Breathing Time Buckets, we describe some new protocols that look promising for efficient parallel simulation.

Sequential Simulation

When SPEEDES runs on one node, the sequential event queue object is automatically created. All the overhead for message sending and rollback is removed. The user still generates messages for his events, but they are not queued up for transmission. Instead, they are turned into events directly. The Delta Exchange mechanism is also used. The combined overhead for message generation and Delta Exchange has been observed to be less than 1% for low-granularity events (i.e., events in which the system overhead dominates).

Time Bucket Synchronization

One of the simplest approaches to parallel simulation makes use of the causality principle. As long as a minimum time interval, T, between events and the events that they can generate is known, the simulation can proceed in time cycles of duration T. This approach is called Time Bucket Synchronization. It has the important property of requiring very little overhead for synchronization. Each node must synchronize with all the other nodes at the end of every cycle, after which all nodes increment their simulation time in unison by the amount T.

Despite the low synchronization overhead, the Time Bucket approach has some drawbacks. The cycle duration T must be large enough for each node to process enough events to make parallel simulation fidelity. Load balancing over the small time interval T can also be a problem.

In most discrete event simulations, the time step T is unknown or, even worse, has the value zero. Thus, simulations that can run under time Bucket synchronization are a subset of all parallel discrete event simulations.

Time Warp

The Time Warp algorithm has been heavily discussed in the. literature. SPEEDES offers a unique set of data structures for managing the event processing in its version of Time Warp.

When an event is processed, it may generate messages. These messages are immediately handed to the TWOSMESS server object supported by SPEEDES. This object assigns a unique ID to the outgoing messages and stores the corresponding antimessages back in the event. Note that antimessages are not complete copies of the original message, but are very short messages used for bookkeeping. All of this is done transparently for the user.

Figure 4:
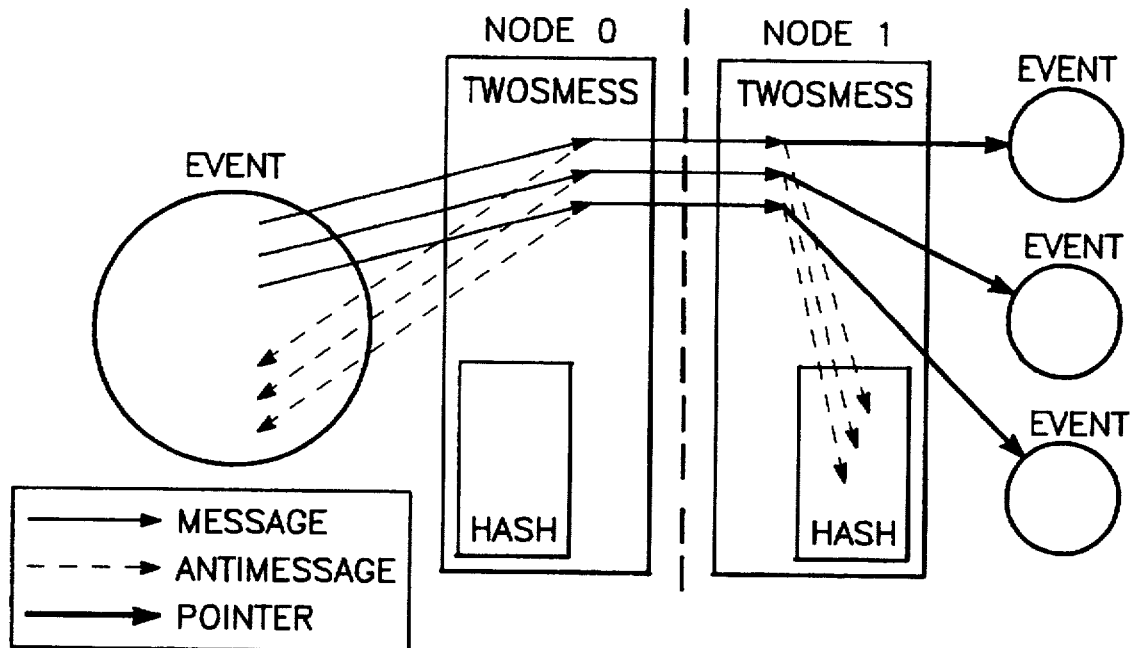
FIG. 4 is a block diagram illustrating the operation of the invention using a time warp protocol.

Referring now to FIG. 4, when a message arrives at its destination, an antimessage is created and stored in the TWOSMESS hash table. The hash table uses the unique message ID generated by the sender. An event is automatically constructed from the message and is handed to the Time Warp event queue object. This event is put in the secondary queue if its time stamp is in the future of the current simulation. Otherwise, the simulation rolls back.

Rollback restores the state of the simulation object, which means calling the Delta Exchange method for all the events processed by that object in reverse order and generating antimessages. Aggressive cancellation is used.

Figure 5:
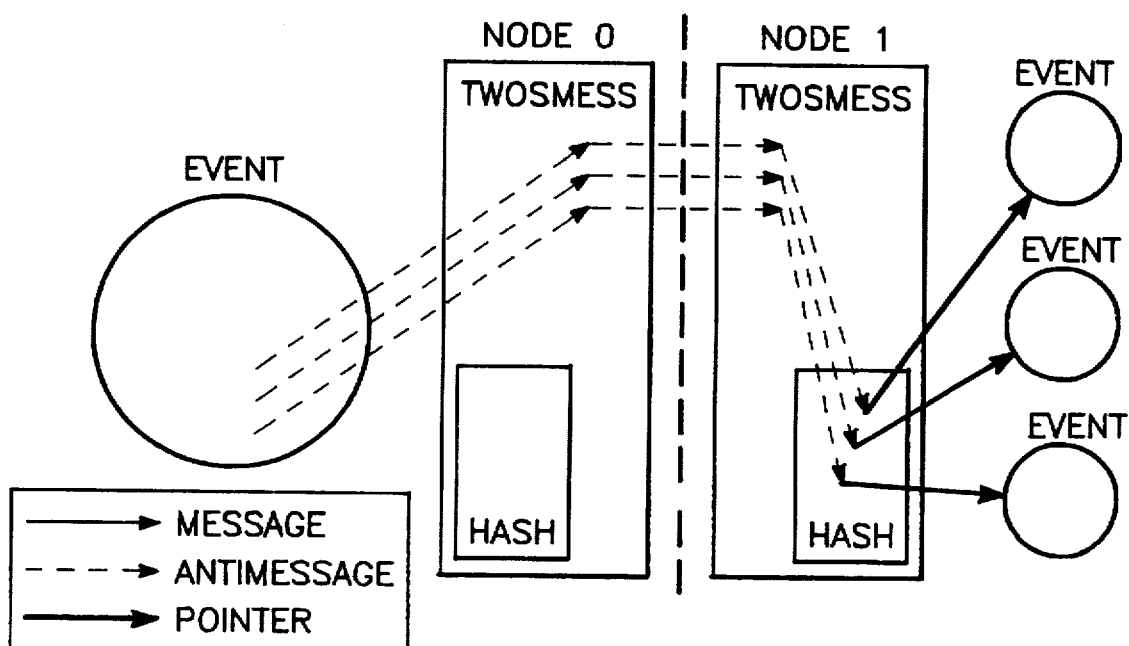
FIG. 5 is a block diagram illustrating the operation of the embodiment corresponding to FIG. 4 whenever an antimessage is transmitted.

Referring now to FIG. 5, antimessages are stored in the events and are simply handed to the TWOSMESS object. When these antimessages arrive at their destinations, the hash table already contains pointers to the events that they created. Those events are then rolled back (if already processed) and marked as not valid.

Periodically (typically every 3 seconds of wall-clock time), the Global Virtual Time (GVT) is updated. The GVT represents the time stamp of the earliest event unprocessed in the simulation. One problem in determining the GVT is in knowing whether messages are still floating about in the system. This problem is solved by having each node keep track of how many messages it has sent and received. Fast synchronous communications are used to determine when the total number of messages sent equals the total number of messages received. When this condition is true, no more messages are in the system and the GVT can be determined.

After the GVT is known, cleanup is performed. The memory for all processed events with time stamps less than or equal to the GVT is handed back to the SPEEDES memory management system (free lists). The hash tables are also cleaned up, as their antimessages are no longer needed.

BREATHING TIME BUCKETS

The original SPEEDES algorithm (Breathing Time Buckets) is a new protocol or windowing parallel simulation strategy with some unique properties. Instead of exploiting lookahead on the message receiver's end or using preknown or calculable delays, it uses optimistic processing with local rollback. However, unlike other optimistic windowing approaches, it never requires antimessages. Local rollback is not a unique concept either. However, the Breathing Time Buckets algorithm allows full connectivity between the simulation objects (often called logical processes).

Fundamental Concepts

The essential synchronization concept for Breathing Time Buckets is the causality principle. Like the Time Bucket approach, the Breathing Time buckets approach processes events in time cycles. However, these time cycles do not use a constant time interval T. They adapt to the optimal width, which is determined by the event horizon. Thus, in each cycle, the maximum number of causally independent events (ignoring locality) is processed. This means that no limiting assumptions are made that restrict the simulation as there are in the Time Bucket approach. Deadlock can never occur, since at least one event is always processed in a cycle.

Figure 6:
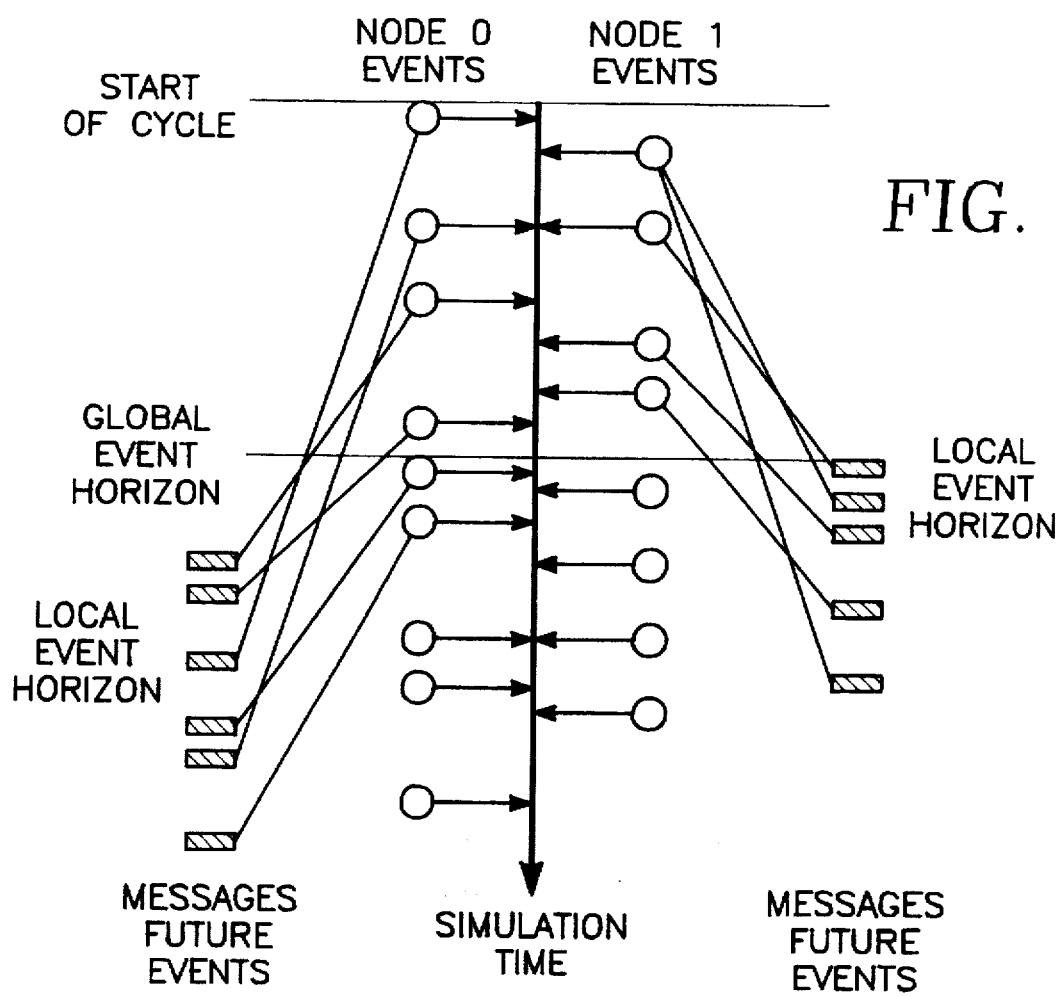
FIG. 6 is a timing diagram illustrating the operation of a preferred embodiment of the invention.

Referring now to FIG. 6, the event horizon is defined as the time stamp of the earliest new event generated in the current cycle (much like the event list management previously described). Processing events beyond this boundary may cause time accidents. Thus, events processed beyond the event horizon may have to be rolled back. The local event horizon for a node is defined as the time stamp of the earliest new event generated by an event on that node. The global (or true) event horizon is the minimum of all local event horizons, as illustrated in FIG. 6. The event horizon then defines the next time step T.

To determine the global event horizon, optimistic event processing is used. However, messages are released only after the true event horizon is determined, so antimessages are never required. Rollback simply involves restoring the object's state and discarding messages erroneously generated. Thus, the Breathing Time Buckets algorithm eliminates all the potential instabilities due to excessive rollback that are sometimes observed in Time Warp. This will be demonstrated later in this specification.

Determining the Event Horizon

Determining the event horizon on a single processor is not very difficult. It is much more challenging to find in parallel. For now, assume that each node is allowed to process its events until its local event horizon is crossed. At this point, all nodes have processed events up to their local event horizon and have stopped at a synchronization point.

The next step is for the node to synchronously communicate its value for the local event horizon. The minimum of all these is defined to be the global event horizon. In other words, the earliest time stamp of a message waiting to be released is identified. The global event horizon is then used to define the global simulation time (GST) of the system.

After the GST is defined, all events with time stamps less than or equal to this time are made permanent. This means that messages which were generated by events that had time stamps less than or equal to the GST are routed through the hardware communication channels to the appropriate node containing the destination object. When messages arrive at their destination nodes, they are fed into the event library, which converts messages into events.

These new events are not immediately inserted into the event queue. Rather, they are collected in a temporary queue as described previously. When all the new events are finally created, the temporary queue is sorted, using a merge sort algorithm that has mlog(m) as a worst-case sort time (for m events). After the temporary queue of new events is sorted, it is merged back into the local event queue.

There is an obvious problem with what has been described so far. Some of the nodes may have processed events that went beyond the GST (i.e., the true event horizon). An event, which is attached to a locally simulated object, must be rolled back if any of the newly generated events affect the same object in its past. Rollback involves discarding the messages generated by the event (which have not yet been released because the time stamp of the event is greater than the GST) and exchanging state variables back with the stimulated object. Thus, rollback overhead should remain small. Antimessages are never needed because bad messages (which would turn into bad events) are never released.

Asynchronous Broadcasts

Figure 7:
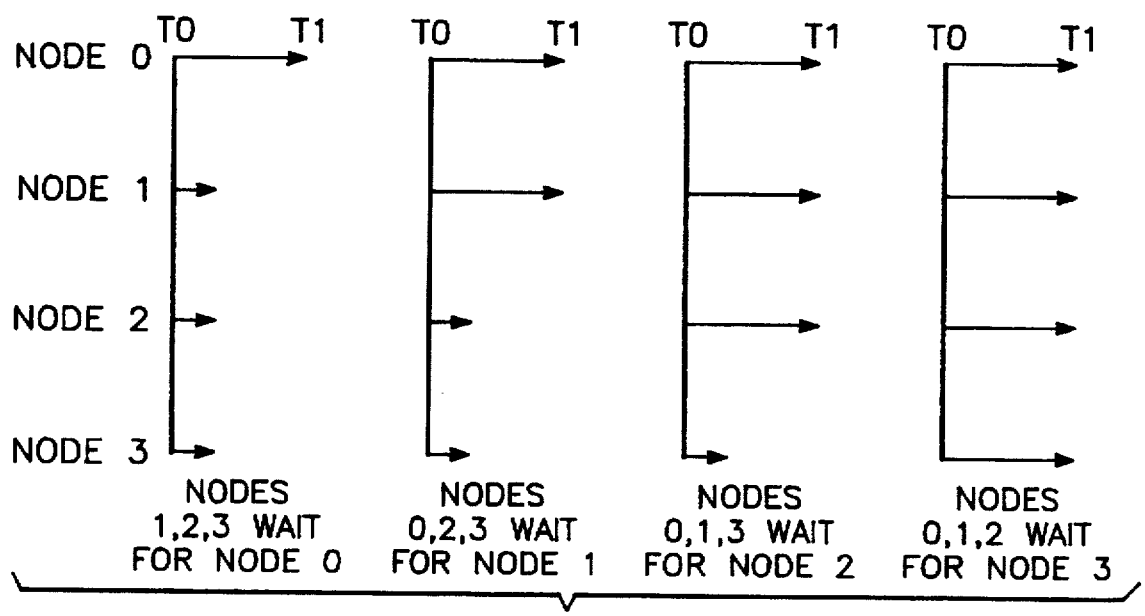
FIG. 7 is a timing diagram illustrating one method of operating the embodiment corresponding to FIG. 6.

If the Breathing Time Buckets algorithm ended here, it would have a limited number of applications. Pathological situations could arise if the algorithm was not modified. For example, FIG. 7 shows how an unbalanced work load could affect performance. The problem with Breathing Time Buckets as presented so far is that all nodes wait for the slowest node to finish. A modification to the basic algorithm is needed to circumvent this problem.

Figure 8:
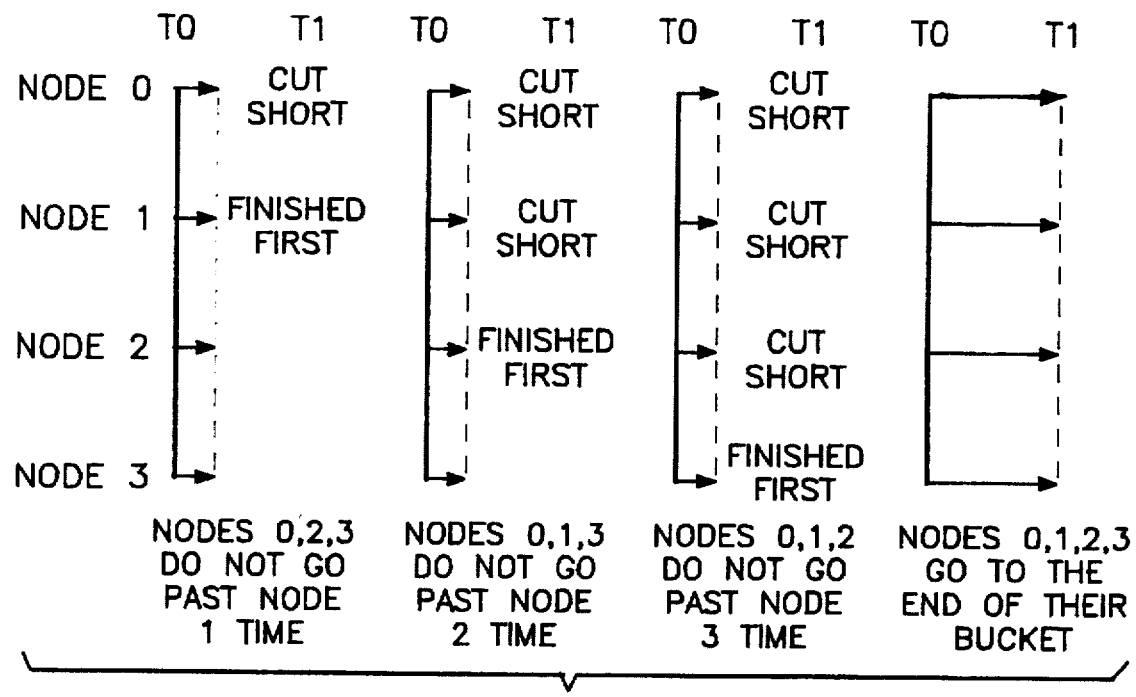
FIG. 8 is a timing diagram illustrating the preferred method of operating the embodiment corresponding to FIG. 6.

A simple mechanism to solve this problem incorporates an asynchronous broadcast mechanism that tells all the nodes when a local event horizon is crossed, and is illustrated in FIG. 8. When one node crosses its local boundary, it broadcasts this simulation time to all the other nodes. When a node receives one of theses broadcast messages, it may determine that it has gone beyond the point of the other node's boundary; thus, it should stop processing. on the other hand, the node may not have reached that time yet, so processing should continue. It is very likely that the first node to cross its local event horizon (in wall-clock time) has a greater value for this boundary than another node. If this happens, a second node will broadcast its time as well. Multiple broadcasts may occur within each cycle.

It is important to get a proper view of the broadcast mechanism. Runaway nodes that process beyond the true event horizon while the rest of the nodes are waiting can ruin the performance of the Breathing Time Buckets algorithm unless something is done. The proper view of the broadcast mechanism is that it aids in speeding up the processing by stopping runaway nodes. The asynchronous broadcasts are in no way required by Breathing Time Buckets to rigorously synchronize event processing. The broadcasts function in the background and only aid in enhancing performance.

Non-Blocking Sync

With the asynchronous broadcast mechanism designed to stop runaway nodes, the Breathing Time Buckets algorithm becomes a viable solution to support general-purpose discrete event simulations. However, there still is room for improvement. It is wasteful for nodes that have crossed their local event horizon to sit idle waiting for other nodes to complete their processing. Note that this problem always arises in the world of synchronous parallel computing. It is important to evenly balance the work load on each node so the time spent waiting for the slowest node to finish its job is minimized. The Breathing Time Buckets algorithm, as described so far, suffers from this same "waiting" problem. An observant simulation expert might ask, "Why do you insist on stopping just because the event horizon has been crossed?" In fact, there really is no reason to stop processing events until all the nodes have crossed the horizon! Erroneously processed events can always be rolled back without much overhead (because no communications are involved). Therefore, it does not hurt to continue processing events beyond the horizon. It might pay to be optimistic and hope that the processed events with time stamps greater than the event horizon do not have to be rolled back. The trick then is to efficiently find out when all the nodes have finished.

One way to support this needed mechanism would be to force each node to send a special message to a central manager when it thinks that it has crossed the event horizon. When the central manager receives this message from all nodes, it broadcasts a message back to the nodes saying that it is time to stop processing events for this cycle. This approach is used when running Breathing Time Buckets on a network for Sun workstations over Ethernet. This mechanism has the good characteristic of being portable. However, it is not scalable to large machines.

Other ways to solve this problem exist, using scalable asynchronous control messages, shared memory, or reduction networks, but a better solution would be to use a global hardware line. The idea here is that when each node crosses the event horizon, it sends a signal on a hardware global line. When all the nodes have done this, an interrupt is simultaneously fired on each node and a flag is set telling us that all nodes have crossed the event horizon.

While the Breathing Time Buckets algorithm does not require global hardware lines for synchronization, making use of the global line has been observed to enhance the performance by as much as 15% over the asynchronous control message approach.

Local Rollback

One further improvement can be made to the Breathing Time Buckets algorithm. Events that are generated locally (i.e., messages that do not leave the node) do not have to participate in the event horizon calculation. Rather, they can be inserted into the event list and possibly be processed within the same cycle. This capability is very important for simulations in which events schedule future events for the same object. A good example of this would be a preemptive priority queueing network. Supporting this capability involves more overhead, but it may be essential for a large class of simulation applications.

INTERACTIVE SPEEDES

This section will discuss the difficulties of supporting interactive simulations. We will then describe how SPEEDES solves these problems.

Simulation Output

In an interactive parallel simulation involving humans, information pertaining to events that have been processed is released to the outside world. Humans can view these data in various forms (graphics, printouts, etc.). Humans are then allowed to interact with the simulation based on information that was previously released.

When a simulation runs on a single computer, using a sorted event queue, events are processed in their correct time order. If the results of processed events were released to the outside world, then they would naturally be viewed in their correct time order. This is not true for parallel simulations.

Figure 9:
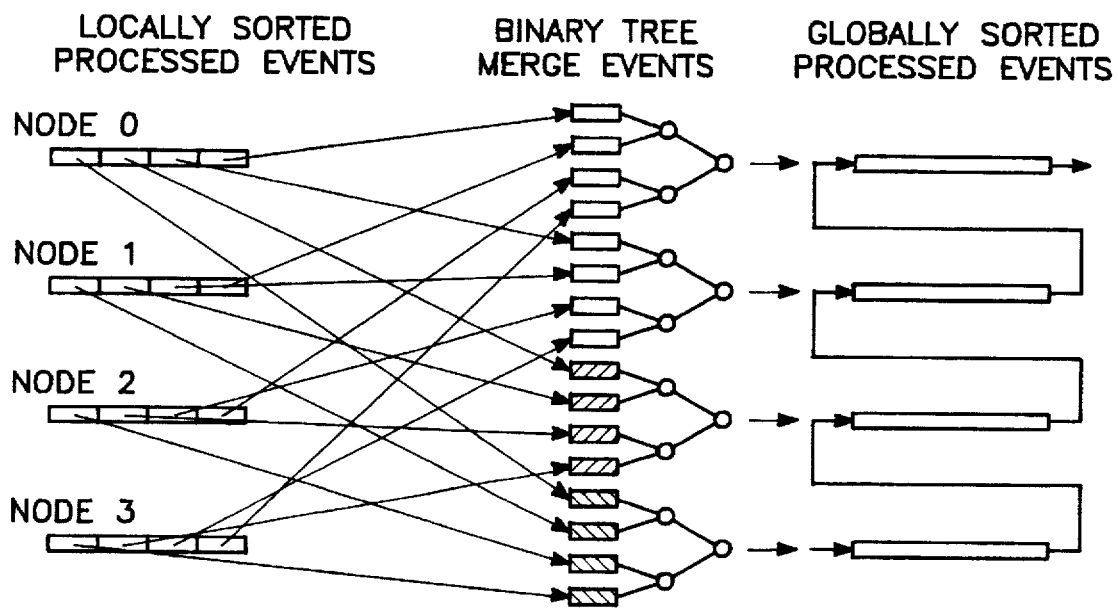
FIG. 9 illustrates how processed events are globally sorted in accordance with the invention.

In parallel simulations that operate in cycles, each node has its own local event queue. Assume that m events are processed globally for a particular cycle and that there are N nodes. Then each node has m/N locally processed events (assuming perfect balance). While these processed events are maintained in their proper time order locally, further steps are required to merge them into a single globally sorted list. The steps to do this on a parallel computer are illustrated in FIG. 9 and are as follows:

The time cycle boundaries $t_I$ and $t_{I+1}$ are known. Assume a flat distribution for the time stamps of the processed events. Each node breaks up its processed event queue into N sublists, each of length $m/N^2$. Every sublist passes to a different node k, where k=0,1,2, . . . N-1. The lower time boundary of each sublist residing on node k is $t_I+k$ $(t_{I+1}-t_I)/N$. All events in each of the sublists on node 0 have time stamps less than those on node 1, etc. At this point, each node performs a local merge sort of its N sorted sublists using a binary search tree. Merging the N sublists on each node takes $(m/N) \log_2 N$ steps. Thus, the time for merging these lists can be written as:

$$T \text{ merge}=(m/N) \log_2 N$$

It would appear that parallel simulations require an additional amount of work to send globally sorted event information out to the external world. However, there is more to consider.

Imagine a simulation in which each event generates a single new event. If m events are globally processed in particular cycle, then each node will receive, on the average (assuming perfect balance), m/N new events. Thus, m/N new events must be inserted back into each local event queue. This can be accomplished by first sorting the m/N events and them merging them back into the local event queue.

Sorting m events for a simulation running on one node takes $m \log_2(m)$ steps. If perfect speedup is attained, one might naively expect it to take $[m \log_2(m)]/N$ steps for N nodes. However, each node's performing the task of sorting m/N events only takes $(m/N) \log_2(n/N)$ steps. There is an apparent superlinear speedup in maintaining the event queue. The amount of time it takes to sort m events on N nodes is better than a factor of N compared with the time on one node. The time for maintaining the event queue can also be written as:

$$T \text{ sort}=(m/N)[\log_2(m)-\log_2 N]$$

When combining Tmerge and Tsort, the superlinear speedup is exactly cancelled. There is no contradiction to the theoretical upper bound for parallel speedup. The best way to understand the apparent superlinear speedup (which is always present in parallel simulations that use local event queues) is to realize that information is lost if the processed events are not regathered into a single globally sorted list for the purpose of output.

Simulation Tie Advancement Rate (STAR) Control

If humans are allowed to interact with a simulation while it is in progress, then it is important for the simulation to advance smoothly in time. In other words, the Simulation Time Advancement Rate (STAR) should be as close to a constant as possible, and equal to one if real-time interaction is desired. Interactive parallel simulations must be able to control the advancement of simulation time with respect to the wall clock.

Figure 10:
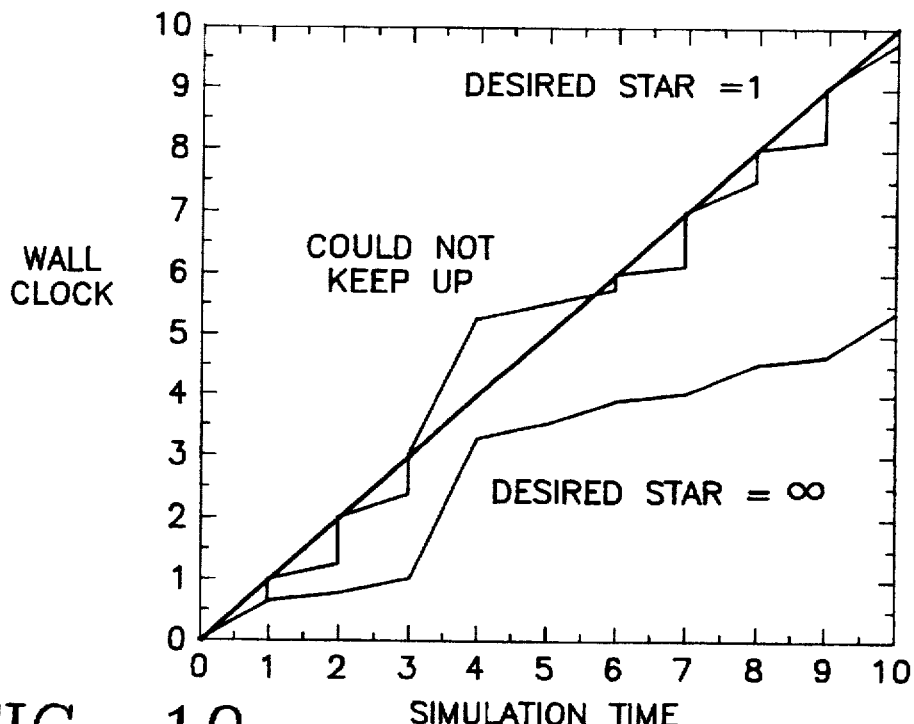
FIG. 10 is a graph illustrating one aspect of the performance of the invention.

One important principle in controlling the STAR is that it can always be slowed down; it is always tougher to speed it up. For example, if a simulation can run two times faster than real time (from start to finish), then pauses can always be added to the simulation to slow it down to real time if desired, as illustrated in the graph of FIG. 10. While the average STAR may run two times faster than real time, the instantaneous STAR at any given time can vary. At times, the instantaneous STAR may be slower than real time. Three important points must be made:

First, the parallel simulation algorithm should run as fast as possible. For example, if the same simulation could run with a STAR equal to ten, using a different approach, then slowing it down to real time would be easier than when using algorithm with a STAR equal to two. The first and most important goal for any interactive parallel simulation approach should be to run as fast as possible.

Second, a mechanism to smooth the STAR is needed. If the simulation is allowed to progress significantly into the future, the results of the simulation can be buffered. The results can then be released to the external world smoothly in time (i.e., throttled by the wall clock). However, when the outside world interacts with the simulation operating in this manner, rollback may be required to bring the simulation back to the time that was perceived by the user. Rollback due to external interactions requires saving the state of all simulated objects at least as far back in time as when the interaction occurred. If the simulation is allowed to progress too far into the future, an enormous amount of memory will be required for rollback state saving.

Another option for smoothing the STAR is to process event sin large cycles and then, as a rule, not allow external interactions to occur until the next cycle. If the cycles are large enough, then the STAR will be smoothed. The cycles must be throttled by the wall clock to maintain the desired STAR. However, large cycles may force an undesirable time granularity into the interactive simulation, and the user may not be able to interact as tightly with the simulation as desired. Furthermore, the information for each processed event coming from the simulation should also be throttled by the wall clock to avoid a choppy-looking simulation.

Third, regardless of whether or not the simulation keeps up with the desired STAR, rigor should always be maintained. Simulation errors (or time accidents) resulting from an attempt to control the STAR should never be allowed to happen. Setting the desired STAR to infinity should have the same meaning as letting the simulation run as fast as possible.

If the simulation cannot keep pace with the desired STAR, then there should be no pauses to throttle the simulation. If the simulation operates in cycles, then it could possibly catch up in the next cycle (and should be allowed to). A resolution for the desired STAR should be specified to determine acceptable performance (in other words, how far the simulation can lag behind the desired STAR and still be within specs).

Human Interactions

In the past, it has been very difficult to support interactive parallel discrete event simulations. Consider, as an example, the Time Warp algorithm as implemented in SPEEDES. In Time Warp, each node keeps track of its own simulation time. Because of the optimistic event processing, there is no certainty of correctness beyond the GVT. Therefore, Time Warp can release to the outside world only those message that have time stamps less than or equal to the GVT. Note that we assume that the outside world (e.g., graphics, humans, and external programs) cannot be rolled back.

If only viewing the results of a simulation were desired, there would be no problem. Output from the simulation could be buffered and released only at GVT update boundaries. However, when the outside world tries to interact with the simulation, the situation becomes more difficult.

Humans like to interact (see the COMMAND section) with the parallel simulation based on the output that has been received (see the QUERY and MONITOR sections). The earliest time the user can interact with the simulation is at the GVT. Otherwise, the law governing external rollbacks would be violated. The goal for interactive parallel simulations is to allow the human to interact as tightly with the simulation as possible.

Figure 11:
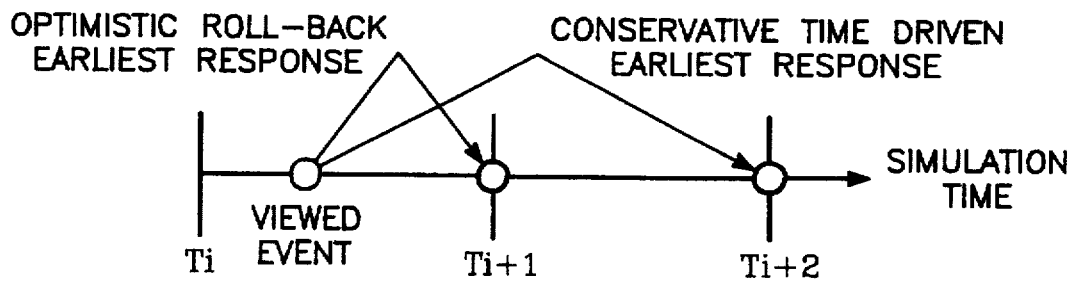
FIG. 11 is a timing diagram illustrating two regimes for responding to an earlier viewed event of the simulation.

In the SPEEDES implementation of Time Warp, an unexpected external message received from the outside world can cause an object to roll back to the GVT. This allows the tightest interactions. Because conservative algorithms (such as Time Bucket synchronization) do not support rollback, they do not permit the same tight interactive capabilities, as illustrated in FIG. 11. This is one of the major drawbacks of conservative algorithms.

EXTERNAL MODULES

Figure 12:
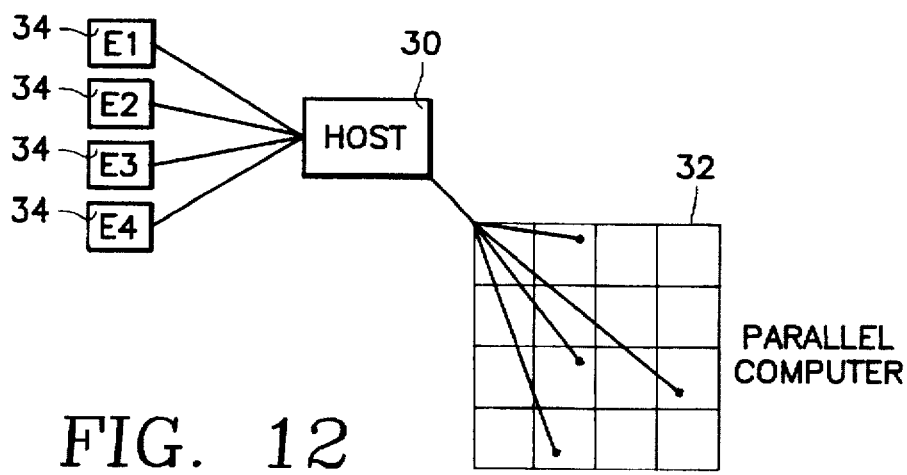
FIG. 12 is a block diagram illustrating the host interactive architecture of the invention.

Referring now to FIG. 12, interactive SPEEDES accommodates external interactions by using a host program 30 to service communications between the central parallel simulation 32 and the outside world. The host program allows external modules 34 to establish connections to the central parallel simulation using, for example, UNIX Berkeley Sockets.

One important characteristic of the SPEEDES approach is that external modules (i.e., external computer programs that would like to be part of the simulation) are not required to participate in any of the high-speed synchronization protocols. Instead, a hybrid approach is used. This is extremely important for interactive simulations over networks that have high latencies. The high-speed central simulation runs on the parallel computer and provides control mechanisms to the outside world.

External modules view the parallel simulation much as a central controller views it. The external modules are still event-driven, but they must not communicate too often with the central simulation. Otherwise, the simulation will be bogged down by the large communication latencies.

Interactive SPEEDES does not make any assumptions concerning the number of external modules or human users participating in the simulation. In fact, the number can change during the course of simulation. The connection procedure simply involves establishing a communication socket to the host.

QUERY

A very useful capability interactive SPEEDES supports is the ability to QUERY the stat of simulation object while the simulation is in progress. The simulation can be viewed as a large database of object that change in time. The QUERY function allows an external user to probe into the objects of the simulation to determine how they are performing.

MONITOR

The MONITOR capability allows the state of a particular simulated object to be monitored as its events occur. The effect of every event for that object can be sent back to the external monitoring module. This can be extremely useful as an analysis tool for studying the behavior of various components within the parallel simulation.

COMMAND

The COMMAND function supported by interactive SPEEDES allows a user to send a command (or generate an event) to a simulation object. This permits users to change the simulation while it is in progress. Commands should work in conjunction with the QUERY and MONITOR functions so the user can change the simulation based on what is perceived.

EXTERNAL MODULE

The last interactive function SPEEDES supports is the control of an EXTERNAL MODULE from within the parallel simulation. It is assumed that external modules are remote objects that tend to have long opaque periods between communications. The are controlled by an object simulated on the parallel computer. The external module attaches itself to a simulation object and then is controlled by that object.

External modules do not participate in the high-speed synchronization algorithms supported internally within SPEEDES. Rather, they are given input messages with a start time, an end time, and their data to process. When the external module has completed processing its data, a done message is sent back to the controlling simulation object. This causes another message to be sent back to the external module, and processing continues.

If the done message has not arrived before the appropriate simulation time, the parallel simulation (which is running faster than the external module) waits. If the done message arrives early, the external module (which is running faster than the parallel simulation) will have to wait for the simulation to catch up before it receives its next message. When an external module disconnects from the simulation (whether on purpose or accidentally), this blocking mechanism is automatically removed.

Time Warp and Breathing Time Buckets are two general-purpose optimistic synchronization strategies for supporting parallel discrete-event simulations. However, each one of these approaches has potential fatal shortcomings. Time Warp may exhibit rollback explosions that can cause an avalanche of antimessages. Breathing Time Buckets, on the other hand, may not be able to process enough events per synchronization cycle to remain efficient.

A new invention, called Breathing Time Warp, has been developed in the Synchronous Parallel Environment for Emulation and Discrete-Event Simulation (SPEEDES) operating system. This new strategy solves both of these problems by mixing the two algorithms together, resulting in the best of both methods.

This specification describes the implementation of the Breathing Time Warp algorithm in SPEEDES, and then shows how this new approach sometimes improves the performance of parallel discrete-event simulations.

HISTORY OF TIME WARP AND BREATHING TIME BUCKETS

Synchronous Parallel Environment for Emulation and Discrete-Event Simulation (SPEEDES) began as a simulation environment that featured a new algorithm (Breathing Time Buckets) for synchronizing parallel discrete-event simulations. As the environment matured, directly comparing this algorithm with other synchronization strategies such as Time Bucket Synchronization and Time Warp became desirable. The most straightforward way to make those comparisons was to support the other algorithms within the SPEEDES environment. This provided a much more accurate capability for measuring different synchronization approaches because when making comparisons, the same simulation code is executed. Also, supporting multiple synchronization strategies in a single environment such as SPEEDES results in a more powerful and flexible simulation system.

Some of the early benchmarks developed under SPEEDES showed the potential problems of Breathing Time Buckets and Time Warp. However, these two algorithms break down in different ways. Breathing Time Buckets is not always able to process enough events per cycle to remain efficient. Time Warp, on the other hand, sometimes exhibits instabilities that can unleash an avalanche of antimessages.

Breathing Time Buckets has one drawback: it requires cycles to process enough events to remain efficient. However, an analytic model or analysis that predicts the number of events processed on the average for each cycle has been developed. This analysis shows that large simulations with many objects and events perform more efficiently with Breathing Time Buckets than small simulations. It also confirms the fact that lookahead, even in optimistic simulations, improves performance.

The Time Warp algorithm has been heavily discussed in the literature. The main distinction between Time Warp and Breathing Time Buckets is that messages in Time Warp are sent optimistically (i.e., aggressively, or with risk). When an event is rolled back, all of the messages that it generated must be canceled by sending antimessages. It is possible for simulations with excessive numbers of rollbacks to produce an explosion of cascading antimessages. This "thrashing" phenomenon can result in unstable performance of Time Warp.

One other distinction between Time Warp and Breathing Time Buckets is the way garbage collection is handled. In Breathing Time Buckets, garbage collection is performed at the end of each cycle while in Time Warp, there are no natural cycle boundaries. Instead, a concept called Global Virtual Time (GVT) is defined as the time tag of the minimum unprocessed event (or message) in the system.

Traditional approaches periodically (typically every three seconds of wall-clock time) pause the simulation for the purpose of globally determining GVT on all of the processors. Garbage collection is then performed for all processed events with time tags less than or equal to GVT.

NEW GVT PROCESS EMPLOYED IN BREATHING TIME WARP

The present invention, Breathing Time Warp, overcomes the foregoing limitations. Breathing Time Warp in SPEEDES uses a unique GVT algorithm, which, in conjunction with incremental state-saving techniques that reduce memory consumption rates, effectively eliminates (for most cases) the possibility of memory consumption problems that can be caused by processing events too optimistically. Complicated and expensive cancel-back algorithms, therefore, are not required, nor are they supported in SPEEDES.

Breathing Time Warp in SPEEDES accepts two run-time input parameters, N1 and N2. As nodes locally process their events, SPEEDES (on each node) keeps track of how many events have been processed locally beyond GVT. When this number exceeds N1 on a node (or there are no more local events to process), the node calls its nonblocking sync function, and without blocking, continues to process events. When the last node makes its call to the nonblocking sync function, all of the nodes simultaneously stop their event processing and GVT is globally determined.

In addition to this, another boundary, N2, is defined to be an upper limit for the number of events that are allowed to be processed beyond GVT. This effectually stops runaway nodes from consuming all of their available memory while still remaining optimistic. Typical values for N1 and N2 used by SPEEDES are 500 and 2,500, respectively. These numbers are tunable, user-defined parameters. Optimal values for N1 and N2 are a function of the hardware and the event granularity of the application, but they are not a function of simulation time.

Choosing N1 and N2 is typically not very difficult. N1 is normally chosen to be large enough so that enough work is done by the processors during each GVT cycle (a function of the hardware and the average event processing work load). N2 should be much larger than N1 so that optimistic event processing is not inhibited, but N2 should not be so large that all of the available memory on a processor can be depleted.

One might observe the similarities of this approach with the Moving Time Window strategy for limiting the amount of optimism in Time Warp. However, unlike Moving Time Windows, the SPEEDES approach is independent of simulation time. It does not require knowledge of the intricate timing strategies in the event scheduling that is performed within the simulation. It does, however, effectively solve (or at least reduce) the problem that overly optimistic simulations may encounter, namely, overconsumption of the available memory on a processor. The Moving Time Windows approach, while successful in some applications, does not have these characteristics in the most general sense.

MOTIVATION FOR BREATHING TIME WARP

Time Warp, the conventional version, has the problem of sometimes being overly optimistic. For example, in simulations where the event granularity is very low (i.e., communications overhead is significant), every message that is sent or received wastes time in the simulation. For these cases, it may be extremely important to only send the messages that have a good chance of being valid. Another way of saying this is, "We want to reduce the risk so that antimessage explosions never happen."

Breathing Time Buckets, at the other extreme, only sends messages that are known to be valid. It, therefore, can be viewed as an approach for providing risk-free Time Warp. Nevertheless, Breathing Time Buckets may be too conservative in its attempt to eliminate the need for antimessages. It may turn out for some applications that cycles in Breathing Time Buckets do not process enough events to remain efficient.

A basic observation of optimistic parallel simulations can be made at this point that is the motivating premise of the Breathing Time Warp algorithm:

Basic Premise

The probability of an optimistically processed event being rolled back tends to increase the further out (in terms of number of events) it is processed beyond GVT. In other words, the further a node gets beyond GVT, the less likely its event processing is valid. This is especially true for runaway nodes that are way out in front of the simulation. Another way of stating this is: Events close to GVT (in terms of numbers of events) tend to be processed correctly, especially if lookahead is available.

With this basic premise as a motivation for designing optimistic, parallel, discrete-event simulations, it makes sense to release the messages generated from events that are close to GVT, but not to immediately release the messages generated by events that are far from GVT. This is the basic strategy of Breathing Time Warp.

BREATHING TIME WARP

The Breathing Time Warp process is a mixture of both Time Warp and Breathing Time Buckets. It should be noted that if there is a minimum time delay, T, between events and the events that they generate (this is one way of describing lookahead), then The Breathing Time Warp algorithm can also be a mixture of Time Buckets. Events can be processed conservatively up to GVT+T so that state-saving overhead, etc. can be eliminated for those events. However, this aspect of the algorithm will not be discussed in this paper.

Each cycle in the Breathing Time Buckets algorithm starts out by using aggressive message sending methods (i.e., Time Warp), but then at some point makes a transition to risk-free message-sending methods (i.e., Breathing Time Buckets). There are multiple phases in the Breathing Time Warp algorithm.

The Time Warp Phase

The Breathing Time Warp algorithm starts every cycle with the Time Warp algorithm. The first N1 events processed beyond GVT have their messages sent out immediately. This means that the messages that are transmitted in this phase might have to be canceled by antimessages, although, as it has already been mentioned, these messages most likely will not require antimessages because the events that generated them are probably valid since they are close to GVT. In a sense, this is the opposite of other risk-free approaches that hold onto messages until it is known that it is safe to process them.

At the start of a processing cycle, each node will possibly have a number of events already processed beyond GVT. The Breathing Time Warp algorithm goes through these events and releases their messages if they have not yet been sent. Note that at most, N1 events will have their messages released. If there are more than N1 optimistically processed events beyond GVT, the Breathing Time Buckets algorithm switches on starting with the N1+1 event.

Event processing is continued with the Time Warp strategy until N1 events have been processed beyond GVT. During this phase, there may be rollbacks and antimessages, but when N1 events have been processed beyond GVT, the Breathing Time Buckets algorithm automatically switches on.

The Breathing Time Buckets Phase

In the Breathing Time Buckets phase, events are processed, but their messages are not released. They are saved within the event, which in SPEEDES is a C++ software object. The minimum time tag of all unsent messages is monitored as an estimate of the event horizon according to the Breathing Time Buckets algorithm.

During the processing of events in the Breathing Time Buckets phase, there may be messages and antimessages working their way through the hardware communications channels. They are received and handled appropriately. It is possible that some of the messages received correspond to events that should have been processed in the Time Warp phase (i.e., events that would have been within N1 events locally from GVT). If this happens, SPEEDES switches back to Time Warp processing (i.e., with aggressive message sending) for that event.

When the event horizon is crossed, all nodes stop their processing and go through a GVT calculation. Note that the event horizon, at this point, might be different from GVT because it is possible for some of the event-generation messages to still be in transit at this time. These messages must be flushed out of the system before GVT can be accurately determined.

The GVT Phase

One of the problems in determining GVT is ensuring that there are no messages remaining in the communications hardware. If a message with a time tag earlier than all other events is still in transit, GVT will be incorrect and simulation errors may occur. Furthermore, it is a good idea to flush all of the messages out of the communications hardware to provide flow control. If this is not done, it is possible to overtax the capabilities of the communications hardware, cause errors, and possibly even cause crashes to occur in the system.

When a node in SPEEDES sends a message asynchronously, a local counter, n_mess_sent, is incremented. Additionally, when a node in SPEEDES receives an asynchronously sent message, a local counter, n__mess__rec, is incremented. During the GVT phase, each node reads incoming messages while at the same time monitoring (globally) whether n__mess__sent is equal to n__mess__rec. In practice, achieving this may be difficult. Some sample code (which has been simplified for this paper) for finding GVT is given in Appendix B hereof.

The Garbage Collection Phase

The garbage collection phase of the Breathing Time Warp algorithm follows immediately after the GVT phase. It is sometimes also called the Phase 2 processing step in the SPEEDES generic cycle and has been discussed in the literature. During this phase, messages which have not yet been released are synchronously sent from all of the processed events with time tags less than or equal to GVT. Furthermore, an additional processing step is permitted for each event (such as sending input/output to the outside world). Then, all rollback-related mechanisms and state-saving memory resources are returned to the SPEEDES operating system.

One important note on how rollback is managed in SPEEDES is that when an event is processed optimistically, it is simultaneously inserted into two processed event lists. One of the lists contains all of the locally processed events on that node and is called Qproc. The size of the Qproc list is used to make comparisons with N1 and N2 (see discussion above on Time Warp). The other list that the processed event resides in is maintained within its own simulation object (i.e., the simulation object that was updated by the event). In other words, each simulation object also contains a list of its processed events.

Figure 13:
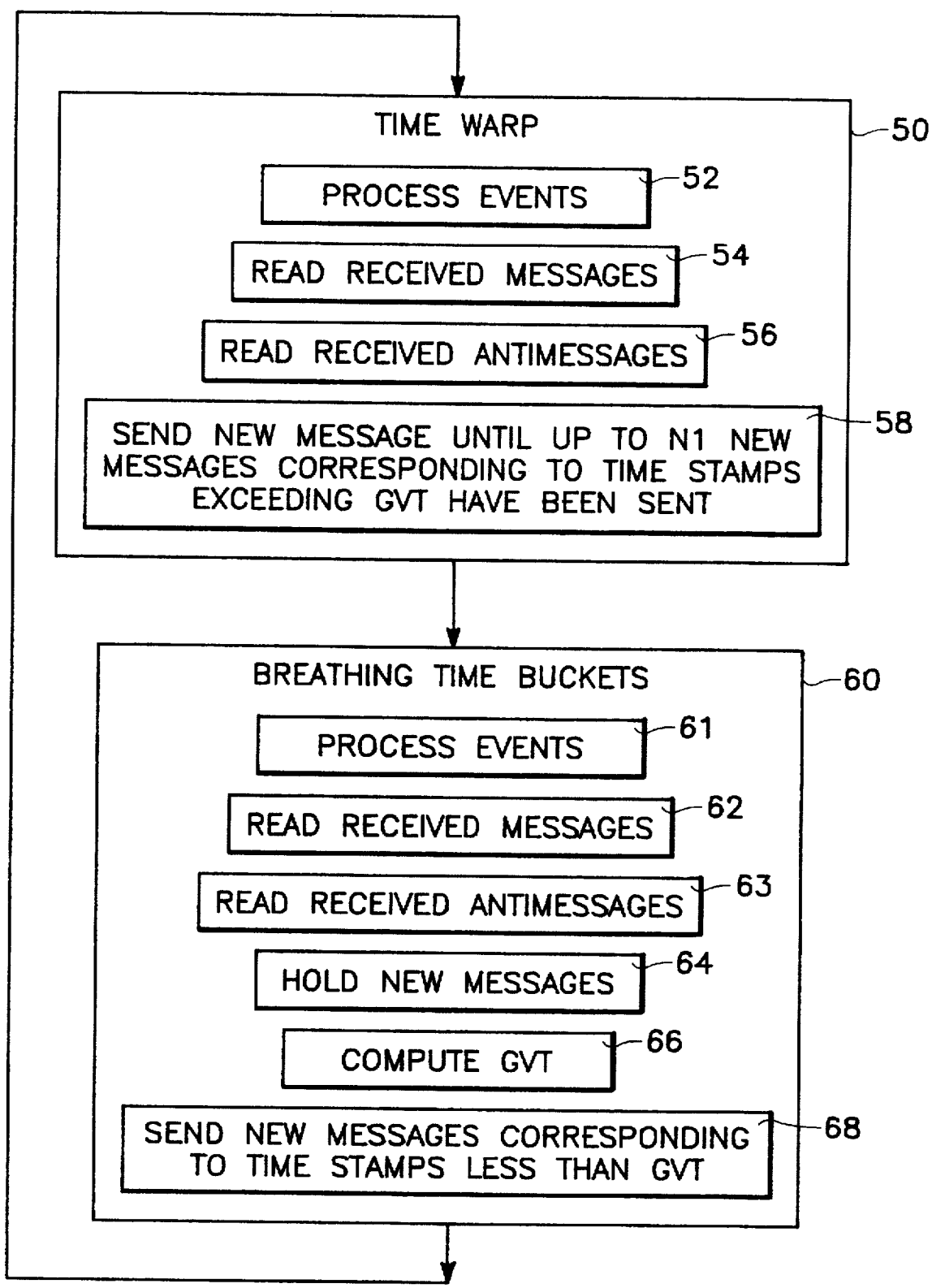
FIG. 13 is a process flow diagram of the breathing time warp process of the invention.

Garbage collection is performed by going through the Qproc list, removing valid events, and then cleaning these events out of their own object's processed list. Systems that do not use a two-list approach (i.e., one for all events processed locally on the node, and another for each object containing its processed events), require every simulation object to be checked for cleanup, even if no events have been processed for that object in the current GVT cycle. If a simulation has many thousands of objects on each node, this overhead can become quite expensive. Therefore, the SPEEDES approach scales much better than other approaches that do not use two processed event lists, but rather have only processed events for each object. The foregoing is summarized in FIG. 13. The preferred process consists of a time warp step (block 50 of FIG. 13) and a breathing time buckets step (block 60). The time warp step of block 50 includes processing events (block 52), reading received messages (block 54) and antimessages (block 56), transmitting new messages generated by the processing sub-step of block 52 and stopping such transmission before N1 new messages corresponding to time stamps greater than GVT have been transmitted (block 58). Thereafter, the breathing time buckets step is performed (block 60), including processing events (block 61), reading received messages (block 62), reading received antimessages (block 63), while refraining from transmitting new messages (block 64). A new value of GVT is computed in the manner described above (block 66) and then new messages corresponding to time stamps less than GVT are transmitted (block 68). The process then cycles back to the time warp step of block 50.

CHARACTERISTICS OF BREATHING TIME WARP

Breathing Time Warp takes on the characteristics of both Breathing Time Buckets and Time Warp. Consider various extremes for a simulation running under the Breathing Time Warp algorithm.

Large Event Horizon

In the case where the event horizon is very large (i.e., many events can be processed each cycle), the Breathing Time Warp algorithm behaves much like the Breathing Time Buckets algorithm because most of the events are processed in the Breathing Time Buckets phase. Performance studies show that for simulations with large event horizons, the Breathing Time Buckets algorithm performs as well as, or better than, Time Warp because of the elimination of anti-messages and because of faster synchronous message sending. As a result, Breathing Time Warp adaptively becomes Breathing Time Buckets for this case.

Small Event Horizon

In the case where the event horizon is very small (i.e., very few events are processed during each cycle), the Breathing Time Warp algorithm behaves much like Time Warp because most of the events are processed in the Time Warp phase. Simulations with small event horizons should not perform well using the Breathing Time Buckets algorithm, but they may perform well using either Time Warp or Breathing Time Warp, especially if the number of objects in the simulation is large.

Theoretical studies and measured performance have shown that simulations which have poor lookahead (i.e., small event horizons) in general do not perform as well as simulations with a high degree of lookahead. Another way of stating this is that without lookahead, Time Warp can exhibit large numbers of rollbacks that may explode into an avalanche of antimessages. Breathing Time Warp handles the problem of avalanching antimessage explosions by not releasing messages after N1 events have been processed beyond GVT. This algorithm then improves on the pure Time Warp algorithm in that it effectively solves the instability problems that are sometimes observed in Time Warp.

TEST RESULTS

Test results confirmed that Breathing Time Warp can improve the performance of parallel discrete-event simulations. Measurements were made using a heterogeneous network consisting of eight high-performance workstations linked together through Ethernet (a very difficult parallel environment to work in). The communication overhead in this environment was quite high compared to the processing power of the workstations involved.

CONCLUSION

Breathing Time Warp is a new process for parallel discrete-event simulation. It adaptively merges the best of Breathing Time Buckets and Time Warp to solve the potential shortcomings of each algorithm. Time Warp can be unstable because of potential antimessage explosions while Breathing Time Buckets can be inefficient if the average number of events processed per cycle is low. Breathing Time Warp has neither of these problems.

Development of the Breathing Time Warp algorithm was motivated by the general observation that events close to GVT (in terms of number of events, not time) tend to be processed correctly while events far from GVT have a greater chance of being rolled back. Thus, it makes sense to aggressively send the generated messages from events close to GVT while not immediately releasing the messages generated from events far from GVT. This approach then provides a much more stable environment for optimistic parallel discrete-event simulation.

A new approach for determining GVT uses two values, N1 and N2, to determine when to compute GVT, and how much to limit the optimism of the simulation. This approach (in conjunction with the incremental state-saving techniques used by SPEEDES) effectively eliminates the need for memory-protection algorithms such as the cancel-back algorithms which are typically found in some advanced Time Warp systems.

Figure 14:
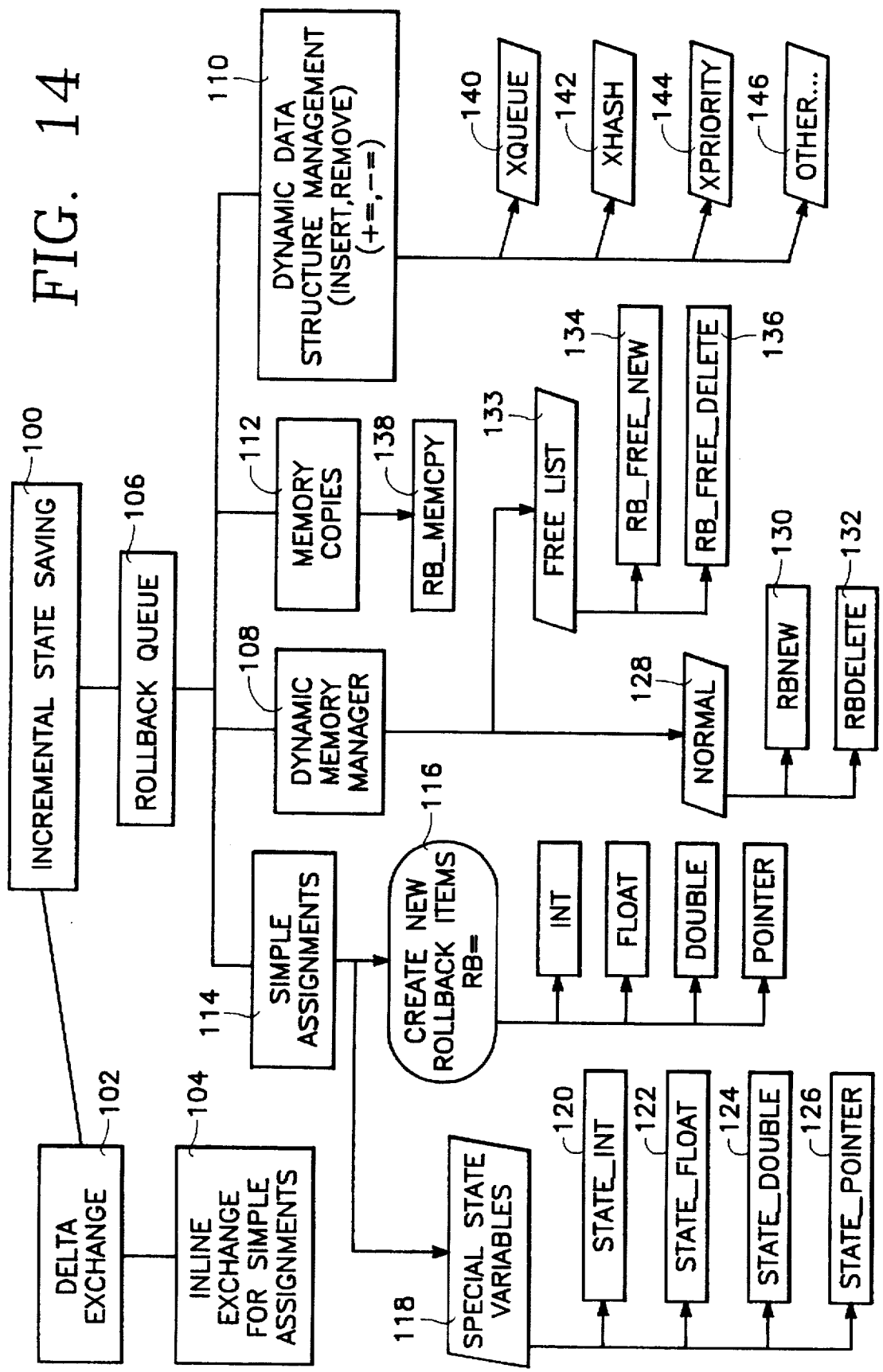
FIG. 14. is a block diagram illustrating an example of the structure of incremental state saving capabilities in SPEEDES.

FIG. 14 illustrates an example of the structure of incremental state saving capabilities in SPEEDES. The structure of the incremental state saving 100 includes the Delta Exchange mechanism 102. An inline EXCHANGE function 104 is defined that is overloaded in SPEEDES to make the Delta Exchange mechanism 102 easier for the user. The EXCHANGE function 104 accepts various types of arguments that can be of different types. By using the EXCHANGE function 104 overloading in C++, values of different types of arguments are easily and efficiently exchanged.

ROLLBACK QUEUE

Although the Delta Exchange mechanism 102 is extremely fast and efficient, a Rollback Queue 106 is also included in SPEEDES's incremental state saving system because the Delta Exchange mechanism 102 is not ideal in every situation. For instance, managing dynamic memory allocations 108, adding or removing an item from a dynamic data structure (such as a list or tree) contained within an object 110, managing memory copies 112, and managing methods inside the simulation object 114 that change values of its internal state variables are some examples of when the Delta Exchange mechanism 102 is not ideal.

Figure 15:
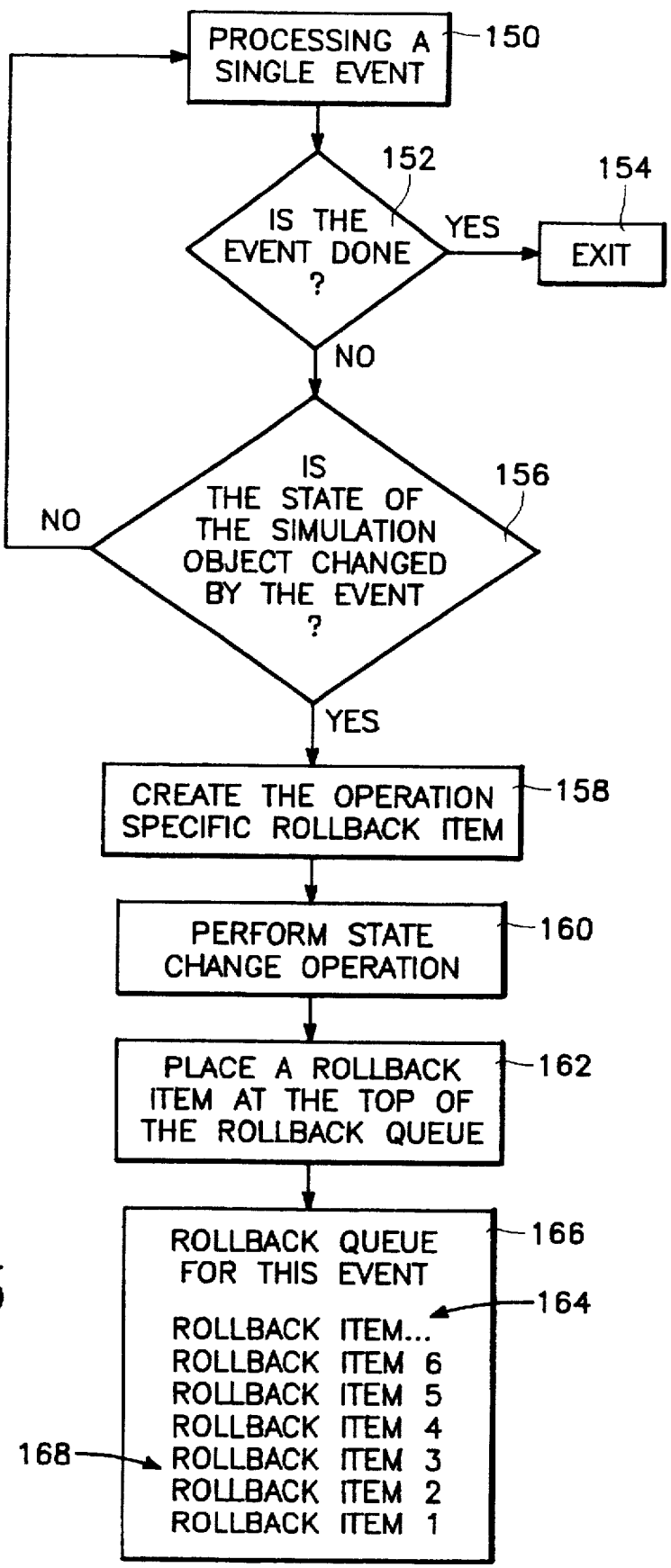
FIG. 15. is a flow diagram illustrating the operation of the Rollback Queue.

FIG. 15 illustrates the operations of the Rollback Queue 106. The Rollback Queue is an incremental state saving operation that is nearly transparent to the user. The Rollback Queue incrementally saves the state of the object as it is modified by event processing and allows the modification of state variables in the simulation objects. The Rollback Queue operations are done for each single event. A set of rollback queue operations are defined that create rollback queue items when invoked. These items are put into the rollback queue for rollback support when necessary. Thus, rollback information is automatically not saved during initialization or when processing events conservatively and not optimistically.

The Rollback Queue saves the changes that occur when an event modifies the state of its simulation object. Hence, because events are rolled back on an event-by-event basis, the Rollback Queue is encapsulated through a hidden base-class in the event object. However, before each event is processed. SPEEDES makes the Rollback Queue available in the simulation object as well, providing a way for the simulation object to alter its state with its own methods.

During the processing of a single event (150), the SPEEDES first determines whether the event is done being processed (152). If the event is done, SPEEDES exits (154) from the Rollback Queue's operations. Otherwise, SPEEDES determines whether the state of the simulation object was changed by the event (156). When an event changes the state of its simulation object, the operation specific rollback item is created (158) and then the state change operation is performed (160). Next, a rollback item is placed (162) onto the top of a particular single event's Rollback Queue 166. Specific rollback items 164, which are C++ objects, inherit from a base-class rollback item object, such as "C__SIMOBJ." A virtual function defined by the base-class simulation object can be "terminate( )." SPEEDES automatically calls this virtual function at the end of the simulation for every object manager and simulation object. This gives each object an opportunity to output the statistics that it might have accumulated during the simulation.

The base-class rollback item defines a store, rollback and clean-up virtual function. Storing values, rolling back an event, or cleaning up the Rollback Queue is accomplished through the store, rollback, and clean-up virtual functions respectively. Also, new types of rollback items can be easily added into the SPEEDES environment.

Storing values is accomplished by retrieving values first, then calling the store virtual function to store the value. Rolling back an event is accomplished by first removing rollback items out of the Rollback Queue, then calling the rollback virtual function to undo the state changes that were done. Next, the rollback items are stored in reverse order in a "qreverse" listing 168. This provides a rollforward capability, which is used for lazy cancellation, which is discussed below. Cleaning up the Rollback Queue is necessary after an event is successfully processed, such as at garbage collection time in Time Warp. This is accomplished by first removing the rollback items out of the Rollback Queue, then calling the clean-up virtual function to clean up the Rollback Queue. In certain cases, some of the rollback items do not require any work for clean-up. In these cases, the virtual clean-up function is called, but no processing is done.

Referring back to FIG. 14, simple assignments 114 are used with the operation of the Rollback Queue 106 to create new rollback items 116 due to the ability to overload operators in C++. SPEEDES provides an assignment operator for simple variable assignments. Instead of using the equal sign ("=") for assignments, SPEEDES provides an "RB=" operator for changing state variables inside simulation objects while providing rollback capability.

The "RB=" assignment operator automatically creates a new rollback item, saves assignment information, and then places it onto the top of the Rollback Queue. When running sequentially, or conservative protocols, the "RB" symbol can be defined as null so that "RB =" reverts back to the simple "=" assignment operator, thus removing all of the rollback memory overhead.

In addition, another simple assignment 114 provides special state variables 118 that can be used as local variables inside an object. State variables 118 are used like a normal variable since default conversions can be defined for an object in C++. Thus, when assignments are made to a state variable, SPEEDES uses operator overloading to store rollback information in case the event is rolled back. For example, STATE__INT 120, STATE__FLOAT 122, STATE__DOUBLE 124, and STATE__POINTER 126 can be provided as state variables. These state variables are automatically initialized to zero in their constructors.

The Rollback Queue also easily accommodates dynamically creating or destroying memory 108. Using the normal method 128, if an event creates memory, then upon rollback, this memory is deleted. Similarly, if an event deletes memory, then upon rollback, the memory is freed again. Thus, the memory is actually only deleted during clean-up. For example, an event can delete a C++ object stored in a simulation object, and then create a new object and save it in the simulation object. An "RB__new" function 130 and an "RB__delete" function 132, for example, can be used to accomplish this. Further, both the Delta Exchange mechanism and the Rollback Queue can be utilized in the same event.

SPEEDES optimizes the performance of all dynamic memory allocations by using "free lists" 133 for faster memory management with for example, the RB__new 130 and RB__delete 132 functions. For instance, instead of calling the RB__new 130 and RB__delete 132 functions, "RB__free_new" 134 and "RB__free__delete" 136 are called. When the free lists are used, memory blocks are never deleted. Instead, the memory blocks are saved in a list for later reuse when the memory is needed again. Free lists 133 accelerate memory allocation and also reduce the problem of memory fragmentation.

In addition, the Rollback Queue copies blocks of memory 112 into the state of the simulation object for certain simulation applications where this is required. Memory copies are supported through, for example, an "RB_memory" 138 function.

Management of dynamic data structures 110 such as lists or trees contained within simulation objects is accomplished by the Exchange Queue. As part of its state, a simulation object may contain a list of items. This list may grow or shrink as events add or remove items to, or from, the list. The Exchange Queue uses reversible operations. Rolling back an event that inserts an item into the Exchange Queue requires removing that item from the Exchange Queue to restore the state. Similarly, rolling back an event that removes an item from the Exchange Queue requires reinserting that item into the Exchange Queue. Also, the Exchange Queue can be a doubly linked list based on the first-in, first-out (FIFO) property.

A "+=" operator can be overloaded for example to add an item to the Exchange Queue, and the "−=" operator can be overloaded to remove an item from the Exchange Queue. An event in SPEEDES can remove an item that is specified by an integer identification from an Exchange Queue, delete it, and then add a new item. The FIFO requirement can also be bypassed. Moreover, the order of the items in the Exchange Queue does not matter since items are removed based on their identification.

SPEEDES manages, through the dynamic data structure management 110, lists of items in various data structures through, for example, "C_XQUEUE" 140, "C_XHASH" 142 and "C_XPRIORITY" 144 data structures, as well as other 146 data structures. All items that are stored in these data structures must inherit from a base-class, such as "C_SQ_ITEM" defined in a header file. Memory for these items can also be managed by a free list tool. The C_SQ$_{ITEM}$ has various methods for setting the item's identification, returning the item's identification, setting the item's time value and returning the item's time value.

The C_XQUEUE data structure is a linked list structure that can be used either as a FIFO queue, or as a general list of items. Items can be added or removed from the C_XQUCEUE while the rollback reverse operations are managed. Basic rollback supported operations for the C_XQUEUE can be inserting an item at the end of the queue, removing the top item from the queue, and removing the item with identification from the queue. In addition, other C_XQUEUE methods can be for example, taking no arguments by the constructor, identifying the number of items in the CXQUEUE, identifying the top item in the C_XQUEUE, identifying the bottom item in the CXQUEUE, and finding the item with the same identification.

Also, the operators "+=" and "−=" are overloaded to add and remove items from the C_XQUEUE. In other words, the xqueue+=item and the xqueue−=item, wherein the xqueue is an C_XQUEUE object and the sq_item is a pointer to an C_SQ_ITEM. The "−=" operator assumes that the C_SQITEM already has a pointer.

The C_XHASH object can be used in a similar manner as the C_XQUEUE. The C_XHASH object is implemented as an array of C_XQUEUE objects and uses modular arithmetic to hash on an integer identification. In other words, the C_XHASH uses the remainder identification percent size, wherein size is the dimension of the C_XQUEUE array, to determine which C_XQUEUE to use to search for the item with the proper identification. The rollback supported operations provided by the C_XHASH object can be inserting an item into the C_XHASH and removing an item with identification from the C_XHASH. In addition, other C_XHASH methods allow the constructor's argument to be the hash size, the number of items in the C_XHASH can find the item with the same identification, a single C_XQUEUE can be formed, and a single C_XQUEUE can be returned.

Also, the operators "+=" and "−=" are overloaded to add and remove items from the C_XHASH. In other words, the xhash+=item and the xhash−=item, wherein the xhash is an C_XHASH object and the sq_item is a pointer to an C_SQ_ITEM. The "−=" operator assumes that the C_SQ_ITEM already has a pointer.

The C_XPRIORITY Queue is based on a SPEEDES Qheap priority queue data structure which is used in SPEEDES for its own event list management. The C_XPRIORITY data structure uses the time_tag field in its list of C_SQITEM's to always return the item with the lowest time_tag. Example basic rollback supported operations for the C_XPRIORITY queue object are inserting the item into the C_XPRIORITY, removing the item with the lowest time_tag, taking no arguments by the constructor, retrieving the earliest time in the list, and retrieving the number of items in the list. Only the "+=" operator is overloaded to add a C_SQITEM to a C_XPRIORITY object.

Therefore, the Rollback Queue can accommodate various types of state-changing requirements such as dynamic memory allocation, memory copies, methods in simulation object that change the state of its internal data, and dynamic data structures such as the Exchange Queue. In addition, if a user needs to schedule an event and then later cancel it, a cancel handle, or a Time Warp antimessage stub, can locate an event that needs to be canceled. A special mechanism is provided in SPEEDES for users to create and destroy cancel handles. The SPEEDES rollback supported cancel handle utilities can be for example returning a new cancel handle and deleting a cancel handle.

LAZY CANCELLATION

Figure 16:
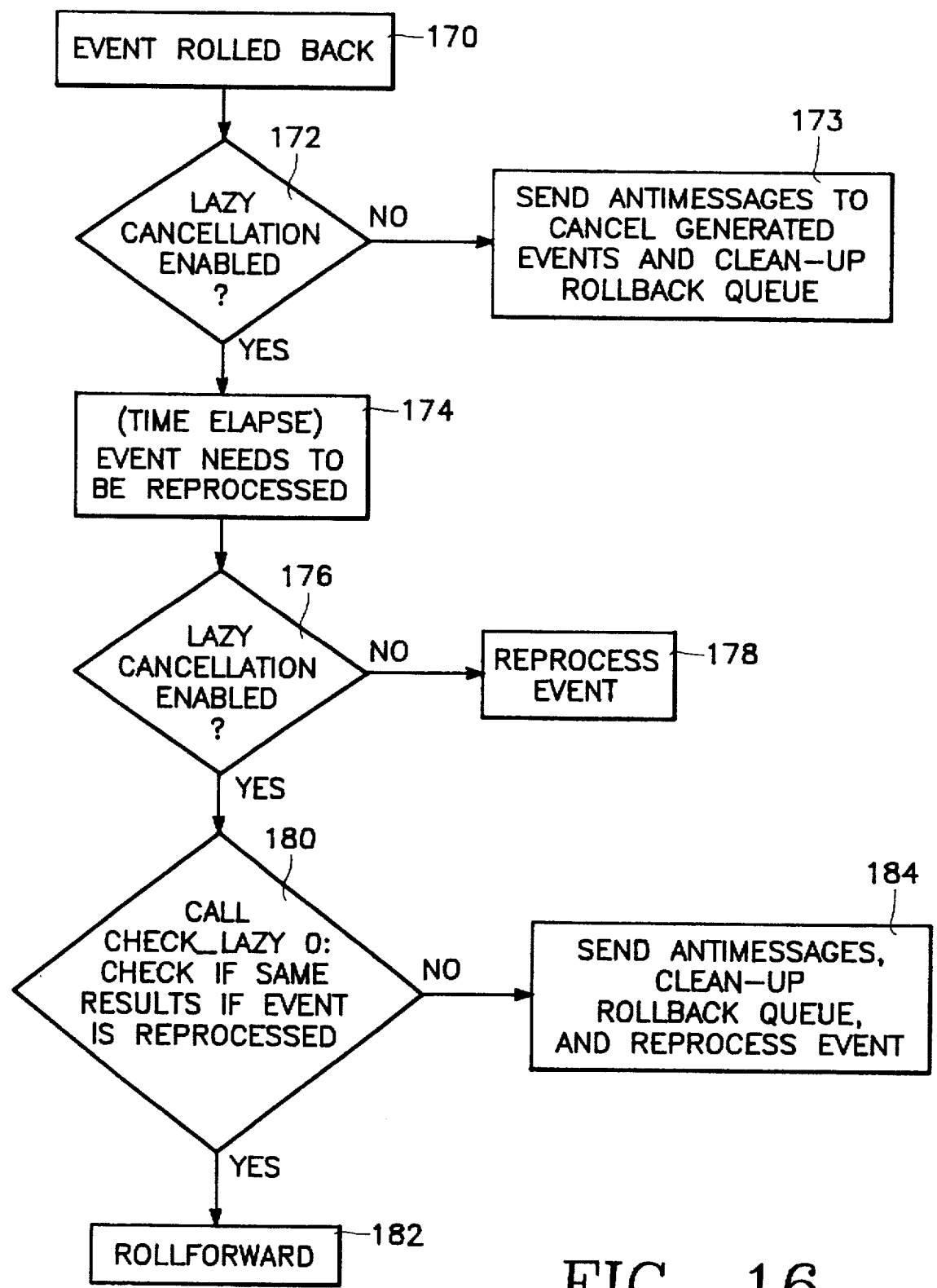
FIG. 16. is a flow diagram illustrating the operation of lazy cancellation.

FIG. 16 illustrates lazy cancellation as supported by SPEEDES. One of the important benefits derived by events being C++ objects is that lazy cancellation can be very efficiently supported. The handling of lazy cancellation by SPEEDES is unique. Lazy cancellation is supported by SPEEDES with an object oriented approach because accidentally processed events for a simulation object in the work order might not matter. The utility of lazy cancellation requires the incremental state saving techniques of rollforward as well as rollback capabilities. Lazy cancellation has the benefit of rolling the state of the simulation object forward using the state change made by the event the first time it was processed, thus requiring all of the incremental state-saving techniques to be reversible.

The object oriented approach of lazy cancellation supported by SPEEDES solves problems experienced by previous parallel discrete simulations. For example, when a rolledback event is reprocessed, the same answer might be produced. In other words, the event makes the same state changes to the simulation object while also generating the same events. This allows for the possibility that a simulation will beat the critical path. The critical path determines the minimum time for a conservative discrete-event simulation to be completed (ignoring all memory overhead other than event processing). It is not possible for conservative simulations to beat the critical path because conservative simulation requires events to be processed in their correct time order.

Moreover, sending antimessages (if Time Warp is used) only to later regenerate the same messages again for events that are rolled back having the same properties is wasteful. Also, reprocessing the event if it makes the same changes to the state of its simulation object is wasteful.

Conventional lazy-cancellation approaches for determining if reprocessing a rolledback event will get the same answer require saving the entire state of the simulation object and then making a byte-for-byte memory comparison with its previous state (ie., when the event was first processed) to the new state. If the results are identical, then, obviously, processing the event will again give the same answer. Another conventional approach avoids sending unnecessary antimessages by comparing (after reprocessing the event), byte-for-byte, the newly generated messages with the old ones (from the first time the event was processed). If they are identical, the new messages do not have to be sent. However, if they are not identical, antimessages to cancel the old messages are sent alone with the new messages that have just been generated. However, these approaches are not feasible in an incremental state-saving environment because they require too much memory overhead.

In contrast, the object oriented approach of lazy cancellation supported by SPEEDES instead rolls the state of the simulation object forward using the state changes made by the event the first time it was processed, thereby requiring all of the incremental state-saving techniques to be reversible. SPEEDES uses an object-oriented approach that very quickly accomplishes the same as the conventional methods without the overhead. The object oriented approach of lazy cancellation supported by SPEEDES is also referred to as lazy reevaluation.

Because events are objects in SPEEDES, the inputs from the simulation object that are required for processing an event can be saved in the data structures of the event object. Before reprocessing the event, and after the event has been rolled back (170), SPEEDES determines whether lazy cancellation has been enabled (172). If lazy cancellation has not been enabled, antimessages are sent to cancel generated events and the Rollback Queue is cleaned-up (173). Later, when the event needs to be reprocessed (174), SPEEDES determines whether lazy cancellation has been enabled (176). If lazy cancellation has not been enabled, the event is reprocessed (178). Otherwise, a virtual function, "check lazy", is called (180). The check lazy virtual function, which is supplied by the user, compares the previous inputs from the simulation object still stored in the event object with the new values in the simulation object. If the values are the same or if the event would still get the same answer, then the event is rolled forward (182). Otherwise, antimessages are sent, the Rollback Queue is cleaned-up, and the event is reprocessed (184). The virtual function can return a "1" if they are the same or if it is determined that the event would still get the same answer. The virtual function can return a "0" otherwise.

After an event has been rolled back, SPEEDES examines a flag stored in the event object to determine whether the event is participating in lazy cancellation. This allows events to participate on a selective basis in lazy cancellation. When it is time to process that event again, SPEEDES determines whether the event would have produced the same answer.

Thus, lazy cancellation as supported by SPEEDES is performed so that the eventprocessing inputs are first saved from the simulation object in the event object. Next, before reprocessing the event, SPEEDES determines if the input values of the simulation object changed or if the input values would produce a different result. If the values are the same, the event is rolled forward, otherwise, an antimessage is sent. Therefore, the approach of the present invention is much more efficient than making byte-for-byte comparisons of the old state of the simulation object with its new states, which is done in most other approaches.

In addition, the lazy cancellation approach of the present invention is more flexible. Events can store important input information in their internal data structures to support sophisticated optimization techniques as well. For example, the user may enable lazy cancellation only for specific events, while using aggressive cancellation as the default for the rest.

PRINT STATEMENTS

During the course of processing events in a simulation, information can be printed to the screen or to a file. However, for more accurate print statements, events can only release output after the event is committed to allow only valid output information from the simulation. The print utility supported by SPEEDES can be, for example, RB_PRINT( ). Also, a file can be printed to an opened file. In addition, the string passed to the RB_PRINT( ) function can be used multiple times in the same event since a separate copy of the string is made by RB_PRINT.

While the invention has been described in detail with specific reference to preferred embodiments thereof, it is understood that variations and modifications thereof may be made without departing from the true spirit and scope of the invention.

APPENDIX A

The following appendix is the listing of the C-language computer code used to implement the invention using the breathing time buckets protocol.

```
// speedes_evtq.H header files
#ifndef speedes_evtq_object
define speedes_evtq_object include "evtq.H"
include "cycle.H"
                         speedes_evtq object class C_SPEEDES_EVTQ : public C_EVTQ { private:
```

```
// speedes_evtq.C method file
#include <stdio.h>
#include "Cros.H"
#include "speedes_evtq.H"

#include "defunc.H"
define OPTIMIZE define INFINITY 1.0e20

C_SPEEDES_EVTQ : construct an event queue object

C_SPEEDES_EVTQ::C_SPEEDES_EVTQ0 {
```

```
protected:
    C_CYCLE *cycle;      // cycle synchronizing object
    C_QUEUE *qext;       // queue of externally generated event
public:

C_SPEEDES_EVTQ( );
    virtual void temp_process( );

virtual void perm_process( );
    virtual void find_gvt( );

};

#endif
```

```
        printf("SPEEDES_EVTQ created\n");

cycle = new C_CYCLE( );
        qext = new C_QUEUE( );

}
``` temp_process - process events phase 1

```
void C_SPEEDES_EVTQ::temp_process( ) {
    int i;
    int nleft;
    double tblock;
    double tmin;
    double tearly;
    double tevent;
    C_EVENT *event;
    C_EVENT *ext_event;
    cycle->start( );     // this starts the cycle management
    n_temp = 0;
    localt = tend;
    tearly = gvt + 0.99*minstep;    // all events with times less than
tearly can be processed conservatively
// . . . if there is a minimum time step, use that information to run
faster
    event = (C_EVENT *)top;
    for (i=0; i<n_items; i++) {
        // . . . handle externally generated events ext_event = external_event(tearly);
        if (ext_event != NULL) {
            qext->push_bot(ext_event);
            if (ext_event->
            get_time_tag( ) < localt) localt = ext_event->get_time_tag( );
            if (cycle->check(localt, event->get_time_tag( ))) break;
        }
```

```
        tevent = event->get_time_tag( );
        if (tevent >= tearly) break;

if (!event->get_processed( )) {
            event->temp_process( );

event->exchange( );
            event->calculate_tmin( );
            event->set_processed( );
        }
```

```
        n_temp++;
        event = (C_EVENT *)event->get_link( );

}

}
// . . . check if blocking messages are expected to arrive if (objects->get_blocking( )) {
        objects->update_block( );
        tblock = objects->get_tblock( );
        cycle->min_tmin(tblock);
    } cycle->stop( );      // stop the current cycle

}
```

```
// . . . update tmin tmin = event->get_tmin( );
    if (tmin < localt) localt = tmin;
    n_temp++;
    event = (C_EVENT *)event->get_link( );

}

// . . . now do the rest of the events optimistically if (!cycle->check(localt, tevent)) { nleft = n_items - n_temp;

for (i = 0; i < nleft; i++) { if (!event->get_processed( )) {

// . . . cycle->check( ) manages asynchronous broadcasts and non-blocking syncs.

if (cycle->check(localt, event->get_time_tag( ))) break;

event->temp_process( );
                event->exchange( );
                event->calculate_tmin( );
                event->set_processed( );
            }
            tmin = event->get_tmin( );
            if (tmin < localt) localt = tmin;
``` perm_process - process events phase 2

```
void C_SPEEDES_EVTQ::perm_process( ) {
    int size;
    int i,len;
``` find_gvt - find the minimum global time for safe processing

```
void C_SPEEDES_EVTQ::find_gvt( ) { gvt = cycle->get_nextgvt( );     // the event horizon is
globally determined

}
```

```
    event = (C_EVENT *)qproc->pop_top( );
    evtype->delete_event(event);

}
// . . . get the incoming messages and turn them into future events while((message = multirouter->getmess(size)) != NULL) {
```

```
char *message;
C_EVENT *event;
C_HOLDER *holder;

C_HEADER *header;
// . . . loop over all of the events that can be processed n_perm = 0;
n_roll = 0;

multirouter->reset( );
while (n_items) {

// . . . pull out processed events, processes them further (garbage collection) and
collect their generated messages event = (C_EVENT *)pop_top( );
   if (gvt < event->get_time_tag( )) {
     push_top(event);
     break;
   } event->perm_process( );
   event->sendmess(qlnd);      // this only collects messages in the multirout
object qproc->push_bot(event);
   if (event->get_time_tag( ) < tend) n_perm++;
}
// . . . send and receive messages synchronously (crystal router on hypercubes)

multirouter->multirout( );

// . . . delete the already processed event using free lists while (qproc->length( )) {
     for (i=0; i<len; i++) {
       event->attach_object( );
       n_roll += event->roll_back( );    // rollback objects with events in their past
       event = (C_EVENT *)event->get_link( );
     }
// . . . merge these new events into the event queue
   merge(qproc);
} header = (C_HEADER *)message;
   if (header->ext) {
     host_user->send_message((C_EM_HEADER *)message);
     //  external
message
   }else{
     event = (C_EVENT *)evtype->message_event(message);
     //  internal
message turns into an event
     qproc->push_bot(event);
   }
}
// . . . get messages that were generated locally on my node and turn
them into events len = qlnd->length( );
for (i=0; i<len; i++) {
   holder = (C_HOLDER *)qlnd->pop_top( );
   message = holder->get_buff( );
   header = (C_HEADER *)message;
   if (header->ext) {
     host_user->send_message((C_EM_HEADER *)message);
     evtype->delete_message(holder);
   }else{
     event = (C_EVENT *)evtype->message_event(message);
     qproc->push_bot(event);
     evtype->delete_message(holder);
   }
}
// . . . sort all of the new events
   qproc->concat(qext);
   qproc->sort( );

// . . . attach these new events to their appropriate objects len = qproc->length( );
event = (C_EVENT *)qproc->ptop( );
```

APPENDIX B

The following is a pseudo-code listing of a software program employed in carrying out the breathing time warp process of the invention:

```
// ....... Determine GVT.
// ....... loop until there are no more messages in the system.
while (1) {
// ....... get all incoming messages and antimessages.
// ....... note: receipt of these might generate additional
// ....... antimessages.
     messages( );        // read all available messages
     antimessages( );    // read all available antimessages
// ....... asynchronous messages are sent through the twosmess
// ....... object which keeps track of n_mess_sent and
// ....... n_mess_rec. We break out of the loop if n_mess_rec
// ....... is equal to n_mess_sent
     if (twosmess->check_messcount( )) break;
}
// ....... get the local virtual time (LVT) as the time tag
// ....... of the next unprocessed event or unsent message
// ....... on my node (i.e., the event horizon).
LVT = get_time_next_event( );
if (LVT > event_horizon) LVT = event_horizon;
// ....... GVT is the global minimum of LVT on all nodes
// ....... the combine function gets the minimum of all LVT's
// ....... and returns the value in the same variable LVT
combine (LVT,MINDBL,sizeof(double),1);
GVT = LVT
combine(LVT,MINDBL,sizeof(double),1); GVT=LVT
```

APPENDIX C

The following is a pseudo-code listing of a software program employed in carrying out the incremental state saving of the invention:

```
THE DELTA EXCHANGE
void EXCHANGE(int &i1, int &i2) {
   int temp;
   temp = i1;
   i1 = i2;
   i2 = temp;
}
void EXCHANGE(double &d1, double &d2) {
   double temp;
   temp = d1;
   d1 = d2;
   d2 = temp;
}
THE ROLLBACK QUEUE
// ..... Rollback Item base class
// ..... Inherits from C_ITEM so that
```

```
// ..... C_RB_ITEMS can be put into a C_QUEUE object
class C_RB_ITEM: public C_ITEM {
    private:
    protected:
        void *ptr;    //pointer to altered state variable
    public:
        void set_ptr(void *p) {ptr = p;} // set the pointer
        virtual void store(int v) {;} // virtual store variable
        virtual void store(float v) {;} // virtual store variable
        virtual void store(double v) {;} // virtual store variable
        virtual void store(void *v) {;} // virtual store variable
        virtual void cleanup( ) {;} // virtual cleanup
        virtual void rollback( ) {;} // virtual rollback
}
// ..... rolling back the Rollback Queue
int rollback( )
    C_RB_ITEM *a;
    C_QUEUE qreverse;
    while (Rollback_Queue—>length( ))  {
        a = (C_RB-ITEM*)Rollback_Queue—>pop_top( );
        a—>rollback( );
        qreverse.push_top(a);    // save for lazy cancellation
    }
    *Rollback Queue = qreverse;
    return Rollback_Queue—>length( ); // return n rollbacks
}
// ..... clean up the Rollback Queue
void clean up( ) {
    C-RB_ITEM *a
    while (Rollback_Queue—>length( )) {
        a = (C_RB_ITEM *)Rollback_Queu—>pop_top( );
        a—>cleanup( );
        delete (a);
    }
}
SIMPLE ASSIGNMENTS
// ..... Rollback Item for integer assignments
class C_RB_ITEM_INT: public C_RB_ITEM {
    private:
        int oldvalue; // old value saved here
    protected:
    public:
        void set_oldvalue(int v) {oldvalue = v;}
        virtual void store(int v) {*(int *) ptr = v;}
        virtual void store(float v) {*(int *) ptr = (int)v;}
        virtual void store(double v) {*(int *) ptr = (int)v;}
        virtual void rollback( ) {
            int temp,
            temp = oldvalue;
            *oldvalue = *(int *)ptr;
            *(int *)ptr = temp;
        }
}
DYNAMIC MEMORY
// ..... Rollback item for dynamic memory
class C_RB_ITEM_MEMORY: public C_RB_ITEM {
    private:
        int flag;    // flag for creation/deletion
    protected:
    public:
        void set_flag (int f) {flag = f;}
        virtual void cleanup( ) {
            if (!flag) delete ptr;
        }
        virtual void rollback( ) {
            if (flag) {
                flag = 0;
            }else{
                flag = 1;
            }
        }
}
// ..... allocate dynamic memory
void RB_new(void *obj) {
    C_RB_ITEM_MEMORY *a;
    a = new C_RB_ITEM_MEMORY( );
    a—>set_ptr(obj);
    a—>set flag(1);
    Rollback_Queue—>push_top(a);
}

// ..... delete dynamic memory
void RB_delete(void *obj) {
    C_RB_ITEM_MEMORY *a;
    a = new C_RB_ITEM_MEMORY( );
    a—>set_ptr(obj);
    a—>set_flag(0);
    Rollback_Queue—>push_top(a);
}
MEMORY COPIES
// ..... Rollback Item for dynamic memory
class C_RB_ITEM_MEMCPY: public C_RB_ITEM {
    private:
        char *oldvalue    // old value of buffer
        int size;         // size of the memory copy
    protected:
    public:
        void set_oldvalue(char *ov) {oldvalue = ov;}
        void set_size(int s) {size = s;}
        virtual void cleanup( ) {
            delete oldvalue;
        }
        virtual void rollback( ) {
            char *temp;
            temp = new char[size];
            memcpy(temp,ptr,size);
            memcpy(ptr,oldvalue,size);
            memcpy(oldvalue,temp,size);
            delete temp;
        }
}
// ..... memory copy using Rollback Queue
void RB_memcpy(char *p1, char *p2, int size) {
    C_RB_ITEM_MEMCPY *a;
    char *oldvalue;
    a = new C_RB_ITEM_MEMCPY( );
    a—>set_ptr(p1);
    a—>set_size(size);
    oldvalue = new char[size];
    memcpy(old value,p1,size);
    a—>set_oldvalue(oldvalue);
    Rollback_Queue—>push_top(a);
    memcpy(p1,p2,size);
}
EXCHANGE QUEUE
// ..... Rollback Item for the Exchange Queue
class C_RB_ITEM_XQUEUE: public C_RB_ITEM {
    private:
        C_XQUEUE *xq     // pointer to Exchange Queue
        int flag;        // flag for insertion or removal
        int top_flag;    //flag for top or bot
    protected:
    public:
        void set_xq(C_XQUEUE *x) {xq = x;}
        void set_flag(int f) {flag = f;}
        void set_top_flag(int f) {top_flag = f:}
        virtual void rollback( ) {
            if (flag) {
                xq—>remove((C_XQ_ITEM *)ptr);
                flag = 0;
            }else{
                if (top-flag) {
                    xq—>push_top((C_XQ_ITEM *)ptr);
                }else{
                    xq—>push_bot((C_XQ_ITEM *)ptr);
                }
                flag = 1;
            }
        }
}
// ..... add an item to the Exchange Queue
void operator += (C_XQUEUE &xq, C_XQ_ITEM *it) {
    C_RB_ITEM_XQUEUE *a;
    a = new C_RB_ITEM_XQUEUE( );
    a—>set_xq(&xq);
    a—>set_ptr(it);
    a—>set_flag(1);
    a—>set_top_flag(0);
    Rollback_Queue—>push_top(a);
    xq.push_bot(it);
}
```

```
// ..... remove an item from the Exchange Queue
void operator -= (C__XQUEUE &xq, C__XQ__ITEM *it) {
    C__RB__ITEM__XQUEUE *a;
    a = new C__RB__ITEM__XQUEUE( );
    a—>set_xq(&xq);
    a—>set_ptr(it);
    a—>set_flag(0);
    a—>set_top_flag(1);
    Rollback_Queue—>push_top(a);
    xq.remove(it);
}
ROLLBACK, AND LAZY CANCELLATION
// ..... Event is processed
event—>init_Rollback_Queue;
event—>PhaseI( );
event—>exchange( );
event—>send_messages( );
// ..... Event is rolled back
event—>exchange( );
event—>init_Rollback_Queue( );
Rollback_Queue—>rollback( );
if (event—>get_lazy_flag( )) {
    event—>send _antimessages( );
}else{
    event—>set_lazy_processed( );
}
// ..... Rollforward or reprocess an event
if (event—>get_lazy_processed( ) ) {
    if (event—>check_lazy( ) {
        event—>init_Rollback_Queue( );
        Rollback_Queue—>rollback( );// Roll forward
        event—>exchange( );
    }else{
        event—>send_antimessages( );
        event—>init_Rollback_Queue( );
        event—>cleanup_Rollback_Queue( );
        event—>PhaseI( );    // Reprocess an event
        event—>exchange( );
        event—>send_messages( );
    }
}
```

What is claimed is:

1. In a system of interconnected processor nodes operating in parallel to simulate mutual interactions of a set of discrete simulation objects distributed among said nodes as a sequence of discrete events changing state variables of respective simulation objects so as to generate new event-defining messages addressed to respective ones of said nodes, a method of performing object-oriented simulation at each one of said nodes comprising:

assigning passive self-contained simulation objects to each one of said nodes;

responding to messages received at one node by generating corresponding active event objects having user-defined inherent capabilities and individual time stamps and corresponding to respective events affecting one of said passive self-contained simulation objects of said one node;

restricting said respective passive self-contained simulation objects to only providing and receiving information from said respective active event objects;

requesting information and changing variables within a passive self-contained simulation object by said active event object; and producing corresponding messages specifying events resulting therefrom by said active event objects.

2. A system of interconnected processor nodes operating in parallel to simulate mutual interactions of a set of discrete simulation objects distributed among said nodes as a sequence of discrete events changing state variables of respective simulation objects so as to generate new event-defining messages addressed to respective ones of said nodes, said system performing object-oriented simulation at each one of said nodes and comprising:

means for assigning passive self-contained simulation objects to each one of said nodes;

means for responding to messages received at one node by generating corresponding active event objects having user-defined inherent capabilities and individual time stamps and corresponding to respective events affecting one of said passive self-contained simulation objects of said one node;

means for restricting said respective passive self-contained simulation objects to only providing and receiving information from said respective active event objects;

means for requesting information and changing variables within a passive self-contained simulation object by said active event object; and means for producing corresponding messages specifying events resulting therefrom by said active event objects.

3. A system of interconnected processor nodes operating in parallel for simulating mutual interactions of a set of discrete simulation objects distributed among said nodes as a sequence of discrete events changing state variables of respective simulation objects so as to generate new event-defining messages addressed to respective ones of said nodes, said system performing object-oriented simulation at each one of said nodes and comprising:

passive self-contained simulation objects assigned to each one of said nodes; and corresponding active event objects generated in response to messages received at one node, said active event objects user-defined inherent capabilities and having individual time stamps and corresponding to respective events affecting one of said passive self-contained simulation objects of said one node, wherein said active event objects request information and change variables within a passive self-contained simulation object and produce corresponding messages specifying events resulting therefrom;

wherein said respective passive self-contained simulation objects are restricted to only providing and receiving information from said respective active event objects.

4. A system of interconnected processor nodes operating in parallel comprising:

a set of discrete simulation objects distributed among said nodes;

a computer program operating on said system for simulating mutual interactions of said set of discrete simulation objects as a sequence of discrete events changing state variables of respective simulation objects so as to generate new event-defining messages addressed to respective ones of said nodes;

wherein said computer program performs object-oriented simulation at each one of said nodes and comprises, passive self-contained simulation objects assigned to each one of said nodes, and corresponding active event objects generated in response to messages received at one node, said active event objects having user-defined inherent capabilities and individual time stamps and corresponding to respective events affecting one of said passive self-contained simulation objects of said one node, wherein said active event objects request information and change variables within a passive self-contained simulation object and produce corresponding messages specifying events resulting therefrom;

wherein said respective passive self-contained simulation objects are restricted to only providing and receiving information from said respective active event objects.

5. A computer-readable medium for causing a computer system of interconnected processor nodes operating in parallel to function as a parallel processing system, comprising:

a computer-readable storage medium;

a computer program stored on said medium;

a set of discrete simulation objects distributed among said nodes;

wherein said computer program operates on said system for simulating mutual interactions of said set of discrete simulation objects as a sequence of discrete events changing state variables of respective simulation objects so as to generate new event-defining messages addressed to respective ones of said nodes and wherein said computer program performs object-oriented simulation at each one of said nodes and comprises, passive self-contained simulation objects assigned to each one of said nodes, and corresponding active event objects generated in response to messages received at one node, said active event objects having user-defined inherent capabilities and individual time stamps and corresponding to respective events affecting one of said passive self-contained simulation objects of said one node, wherein said active event objects request information and change variables within a passive self-contained simulation object and produce corresponding messages specifying events resulting therefrom;

wherein said respective passive self-contained simulation objects are restricted to only providing and receiving information from said respective active event objects.

* * * * *